United States Patent
Kuribayashi et al.

(10) Patent No.: US 6,374,205 B1
(45) Date of Patent: Apr. 16, 2002

(54) METHOD OF REDUCING CIRCUIT DATA, METHOD OF SIMULATING CIRCUIT, AND MEDIUM FOR STORING CIRCUIT DATA REDUCTION PROGRAM

(75) Inventors: Mototaka Kuribayashi; Masaaki Yamada, both of Tokyo; Hideki Takeuchi, Tokoy, all of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/248,989

(22) Filed: Feb. 12, 1999

(30) Foreign Application Priority Data

Feb. 13, 1998 (JP) .......................................... 10-031711

(51) Int. Cl.$^7$ .......................... G06F 9/455; G06F 17/50
(52) U.S. Cl. ................................. 703/14; 703/22; 716/2; 716/4
(58) Field of Search ............................. 703/14–16, 22; 716/2, 5, 4

(56) References Cited

U.S. PATENT DOCUMENTS 5,644,498 A * 7/1997 Joly et al. ....................... 716/2
5,920,484 A * 7/1999 Nguyen et al. ................ 703/2

OTHER PUBLICATIONS

Kao, et al. "A Modeling and Circuit Reduction Methodology for Circuit Simulation of DRAM Circuits", IEEE International Workshop on Memory Technology, Design and Testing, pp. 15–20, Aug. 1995.*

Llopis et al., "A Fast and Accurate Characterization Method for Full–CMOS Circuits", Proc. Conf. on Eurpoean Design Automation, pp. 410–415, Sep. 1992.*

Coumeri et al., "Memory Modeling System for Synthesis", International Symposium on Low Power Electronics and Design, pp. 179–184, Aug. 1998.*

Elfadel et al., "A Block Rational Arnoldi Algorithm for Multipoint Passive Model order Reduction of Multiport RLC Networks", IEEE/ACM International Conf. on Computer–Aided Design, pp. 66–71, Nov. 1997.*

Ogawa, K., et al., "PASTEL: A Parameterized Memory Characterization System," The 11th Karuizawa Workshop on Circuits and Systems, Apr. 21–22, 1997.

Kao, W., et al., "A Modeling and Circuit Reduction Methodology for Circuit Simulation of DRAM Circuit," IEEE, pp. 15–20 (1995).

Kuribayashi, M., et al., "SCR: SPICE Netlist Reduction Tool," IEEE Circuits and Systems Society, Tokyo Chapter, Apr. 21, 1998.

* cited by examiner

Primary Examiner—Russell W. Frejd
(74) Attorney, Agent, or Firm—Foley & Lardner

(57) ABSTRACT

A method reduces circuit data to be simulated, by extracting element data that influences a result of simulation out of the circuit data, thereby shortening a simulation time while maintaining the accuracy of simulation. Also provided is a simulation method that employs the reduction method. The method includes the steps of entering one of an input vector and/or an observation point for the circuit data to be simulated, and extracting an element data corresponding to a node influenced by propagation of a varying state of the input signal, the varying state for the node having an influence for the observation point, from the circuit data according to the input vector and/or observation point.

The extracted nodes and elements related thereto are used to prepare reduced circuit data that is simulated. The method reduces the scale of a circuit to simulate by extracting only essential elements that affect a result of simulation from circuit data such as a netlist that forms the circuit to be simulated.

22 Claims, 30 Drawing Sheets

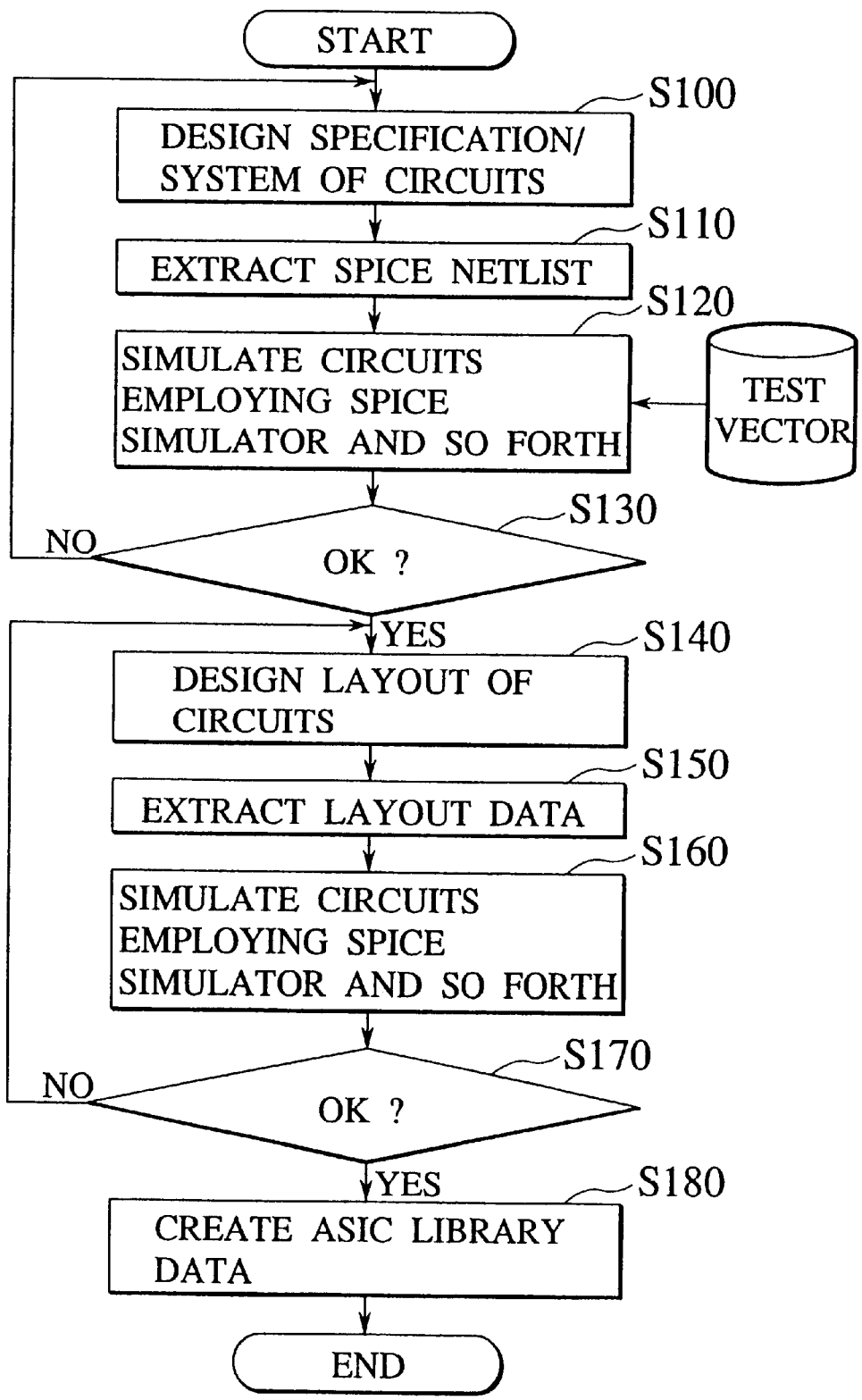

FIG.15

```
*--- 2 * 2 memory cell ---
VSS 1 0 3.3V
***
*VINA INA 0 0.0
*VINA INA 0 0.0
*
VIN 1  IN1    0  pwl(0 3.3 2n 3.3 2.38n 0 5n 0)  ⎫
VIN 2  IN2    0  3.3                              ⎬ L1
*                                                 ⎭
.SUBCKT IV A Z 1 · · · · · · · · · · · · · · · · L2
MP9 1 A Z pmos L= 3.600E-07  W = 1.502E-0.5w
MP8 Z A Z nmos L= 3.600E-07  W = 1.502E-0.5w
.ENDS IV
***
XIV44 IN1 W1 1 IV
XIV55 IN2 W2 1 IV
***
XIV00 N1 N2 1 IV
XIV01 N2 N1 1 IV
XIV10 N3 N4 1 IV
XIV11 N4 N3 1 IV
XIV02 N5 N6 1 IV
XIV03 N6 N5 1 IV
XIV12 N7 N8 1 IV
XIV13 N8 N7 1 IV
***
MN0 BIT1 W1 N1    0 nmos L= 3.600E-07 W= 1.520E-0.5w ⎫
MN1 N2 W1 BITN1   0 nmos L= 3.600E-07 W= 1.520E-0.5w │
MN2 BIT2 W1 N3    0 nmos L= 3.600E-07 W= 1.520E-0.5w │
MN3 N4 W1 BITN2   0 nmos L= 3.600E-07 W= 1.520E-0.5w ⎬ L3
MN4 BIT1 W2 N5    0 nmos L= 3.600E-07 W= 1.520E-0.5w │
MN5 N6 W2 BITN1   0 nmos L= 3.600E-07 W= 1.520E-0.5w │
MN6 BIT2 W2 N7    0 nmos L= 3.600E-07 W= 1.520E-0.5w │
MN7 N8 W2 BITN2   0 nmos L= 3.600E-07 W= 1.520E-0.5w ⎭
*
.IC  V(N1) = 0.0 V(N3) = 0.0 V (N5) = 0.0 V(N7) = 0.0 ⎫ L4
.IC  V(N2) = 3.3 V(N4) = 3.3 V (N6) = 3.3 V(N8) = 3.3 ⎭
*
*COUT   OUT 0 30.0nF
*COUT   OUT 0 0.3pF
*
.TRAN 0.05N  5N   UIC
*
*.IC       V(OUT) = 3.3
.SAVA TRAN V(W1) V(BIT1) V(BITN1) · · · · · · · · · L5
*.PRINT TRAN V(W1) V(B1) V(BIN)
*.MODEL nmos NMOS
*.MODEL pmos PMOS
***                                                ***
***********************************************************
*---+----1----+----2----+----3----+----4----+----5----+----6----+----7--
**************
*** Nch MOS ***
**************

.MODEL nmos NMOS LEVEL=4 · · · · · · · · · · · · · L6

(DESCRIPTION ON PARAMETERS OF SPICE MODEL)

**************
*** Pch MOS ***
**************

.MODEL pmos PMOS LEVEL = 4

(DESCRIPTION ON PARAMETERS OF SPICE MODEL) · · · · · · L7

.OPTIONS LIMPTS 20000 ITL5 20000 GMIN 1.001E-12 NUMDGT 6
.COPY
.END
```

FIG.16

```
* SPICE netlist reduced by SCR
*
.TRAN 0.05N 5N UIC
.MODEL nmos NMOS LEVEL=4

(DESCRIPTIONS ON PARAMETERS OF SPICE MODEL)

.MODEL pmos PMOS LEVEL = 4

(DESCRIPTIONS ON PARAMETERS OF SPICE MODEL)

.OPTIONS LIMPTS 20000  ITL5 20000  GMIN 1.001E-12 NUMDGT 6
.COPY
.IC    V( N1 )  = 0.000000
.IC    V( N2 )  = 3.300000
.SAVE TRAN     V( W1 )              }L8
.SAVE TRAN     V( BIT1 )
.SAVE TRAN     V( BITN1 )
*******  The following two lines were added by SCR.  *****************
V:VDDSCR VDDSCR 0 3.3
V:GNDSCR GNDSCR 0 0
V:IN1 IN1 0 pwl ( 0 3.3 2n 3.3 2.38n 0 5n 0 )
M:N3 VDDSCR W1 GNDSCR GNDSCR nmos L = 3.600E-07 W= 1.520E-05w
M:N2 GNDSCR W1 GNDSCR GNDSCR nmos L = 3.600E-07 W= 1.520E-05w
M:N1 N2 W1 BITN1 GNDSCR nmos L=3.600E-07 W= 1.520E-05w
M:N0 BIT1 W1 N1 GNDSCR nmos L=3.600E-07 W= 1.520E-05w
M:IV44/N8 W1 IN1 GNDSCR GNDSCR nmos L=3.600E-07 W= 1.520E-05w
M:IV44/P9 VDDSCR IN1 W1 VDDSCR pmos L=3.600E-07 W= 1.520E-05w
M:IV01/N8 N1 N2 GNDSCR GNDSCR nmos L=3.600E-07 W= 1.520E-05w        }L9
M:IV01/P9 VDDSCR N2 N1 VDDSCR pmos L=3.600E-07 W= 1.520E-05w
M:IV00/N8 N2 N1 GNDSCR GNDSCR nmos L=3.600E-07 W= 1.520E-05w
M:IV00/P9 VDDSCR N1 N2 VDDSCR pmos L=3.600E-07 W= 1.520E-05w
M:N4 BIT1 GNDSCR GNDSCR GNDSCR nmos L=3.600E-07 W= 1.520E-05w
M:N5 VDDSCR GNDSCR BITN1 GVDSCR nmos L=3.600E-07 W= 1.520E-05w
.END
```

FIG. 17

```
****************************************************
                                                
                                                
      SPICE Critical Path Reduction Tool Log File   
                                                
      scr:                                      
                                                
                                                
****************************************************
(Title) : \begin {verbatim}

(Netlist File) : 2w2cmemorycell_scr3.net
(Log File) : 2w2cmemorycell_scr3.log
(Spi File) : 2w2cmemorycell_scr3.spi
(Bound Direction) : Not Effective
(Spread Extracted Region) :
0 step
(Neglect Resistors in Expanding States) :
Not Effective
(Date) : Fri Sep 12 17:00:30 1997

****************************************************
**   The information about the input nodes.
****************************************************
The number of the input nodes is 1 · · · · · · · · · · · · · · · · L10
****************************************************
**   The information about the output nodes.
****************************************************
The number of the output nodes is 3 · · · · · · · · · · · · · · · L11
****************************************************
**   The information about the extracted nodes.
****************************************************
The number of the extracted nodes = 6 / 18 · · · · · · · · · · · · L12

****************************************************
**   The information about the extracted elements.
****************************************************
The number of the extracted MOSFETs    = 12 / 28   ⎫
The number of the extracted resistors  = 0 / 0     ⎬ L13
The number of the extracted capacitors = 0 / 0     ⎭

****************************************************
**   TIME ACCOUNTING INFO
****************************************************
CPU time (user)    = 0.1 sec                       ⎫
CPU time (system)  = 0.0 sec                       ⎬ L14
                                                   ⎭
****************************************************
**   RESOURCE INFO
****************************************************
Used Memory       = 1521 byte · · · · · · · · · · · · · · · · · L15

****************************************************
                                                
      End of SPICE Critical Path Reduction Tool Log File   
                                                
****************************************************
```

FIG.26

```
BSS1   0   3.3V
VIN1   IN1   0    pwl(03.3 2n 3.3 2.38n 0 5n 0)
VIN2   IN2   0    3.3
.SUBCKT IV A Z I
MP9 1 A Z 1 pmos L=3.600E-07 W=1.520E-05w
MP8 Z A 0 0 nmos L=3.600E-07 W=1.520E-05w
.ENDS IV
XIV44 IN1 W1 1 IV
XIV55 IN2 W2 1 IV
XIV00 N1 N2 1 IV
XIV01 N2 N1 1 IV
XIV10 N3 N4 1 IV
XIV11 N4 N3 1 IV
XIV02 N5 N6 1 IV
XIV03 N6 N5 1 IV
XIV12 N7 N8 1 IV
XIV13 N8 N7 1 IV
MN0 BIT1 W1 N1 0 nmos L=3.600E-07 W=1.520E-05w
MN1 N2 W1 BITN1 0 nmos L=3.600E-07 W=1.520E-05w
MN2 BIT2 W1 N3 0 nmos L=3.600E-07 W=1.520E-05w
MN3 N4 W1 BITN2 0 nmos L=3.600E-07 W=1.520E-05w
MN4 BIT1 W2 N5 0 nmos L=3.600E-07 W=1.520E-05w
MN5 N6 W2 BITN1 0 nmos L=3.600E-07 W=1.520E-05w
MN6 BIT2 W2 N7 0 nmos L=3.600E-07 W=1.520E-05w
MN7 N8 W2 BITN2 0 nmos L=3.600E-07 W=1.520E-05w
.IC    V(N1)=0.0 V(N3)=0.0 V(N5)=0.0 V(N7)=0.0
.IC    V(N2)=3.3 V(N4)=3.3 V(N6)=3.3 V(N8)=3.3
.TRAN 0.05N 5N UIC
.PRINT TRAN V(BIT1) V(BIT1)
.MODEL nmos NMOS LEVEL=4
(DESCRIPTION ON PARAMETERS OF SPICE MODEL)
.MODEL pmos PMOS LEVEL=4
(DESCRIPTION ON PARAMETERS OF SPICE MODEL)
.END
```

METHOD OF REDUCING CIRCUIT DATA, METHOD OF SIMULATING CIRCUIT, AND MEDIUM FOR STORING CIRCUIT DATA REDUCTION PROGRAM

BACKGROUND OF THE INVENTION

1. Field of the Invention

The present invention relates to a method of reducing circuit data and a method of simulating circuits. In particular, the present invention relates to a technique of automatically designing an integrated circuit. This technique receives circuit data for an integrated circuit to be simulated, extracts data that influences a result of simulation from the received circuit data, and automatically reduces the circuit data used for the simulation, thereby shortening a simulation time while maintaining the accuracy of simulation.

2. Description of the Related Art

Designing an LSI involves many EDA (electronic design automation) tools in respective stages. These tools are essential for automatically designing ASICs (application specific integrated circuits) such as memories, in particular, SRAMs. The automatic designing technology is improving to meet requirements for large-scale memories and a short turn around time.

FIG. 1 shows the steps of designing an LSI such as a memory. Designing an LSI involves many stages and in each of which the characteristics of a designed circuit must be verified by simulation. The simulation is carried out by, for example, SPICE. The SPICE receives a netlist, which is a text expression of the characteristics and connections of elements of the designed circuit. According to the netlist, the SPICE analyzes and verifies the timing, functions, and power consumption of the elements. The simulation is repeated through the steps shown in FIG. 1. For example, in one of the steps, a schematic data prepared by a circuit drawing editor is used to prepare a netlist for simulation. In another step, data including resistance and capacitance is used to prepare a netlist for simulation. These simulation processes take a large part of time needed for designing an LSI.

Circuit simulators used to design ASICs must secure analytic accuracy, a practical simulation time, a capability of handling large-scale circuits, and a short turn around time.

Prior arts hardly satisfy these requirements for simulating ASICs such as memories, in particular, RAMs. The memories involve a large circuit scale and a variety of word-bit combinations, to take a long simulation time. Fine memories need a precise extraction of parasitic elements, to extend a calculation time for simulation. Large-scale memories have more elements than those (6000 to 7000) being able to be handled by the SPICE, to deteriorate simulation accuracy because the SPICE is able to simulate only part of such large-scale memories. These constitute a bottleneck in designing memory circuits.

To remove the bottleneck, circuit reduction is carried out. The circuit reduction reduces the size of a circuit to be simulated, to thereby shorten a simulation time to a practical level.

To simulate a large-scale ASIC such as a memory, a reduced netlist is prepared for a simulator. The reduced netlist must secure the accuracy of simulation in addition to sufficiently reducing the circuit scale of the memory to simulate.

A reduction method according to a conventional scheme will be explained.

A reduction of a circuit such as a RAM is usually manual according to the conventional scheme. The prior art manually prepares an equivalent circuit of a circuit, and the equivalent circuit is small enough to be simulated by the SPICE. For example, a RAM has regularly arranged parts as shown in FIG. 2(A), and the prior art reduces the regular parts into an equivalent capacitance element of FIG. 2(B).

The conventional scheme carries out this reduction manually, to critically elongate a design period and provide an unsatisfactory reduction result in circuit scale. Since simulation must be repeated to verify the characteristics of a circuit in each design stage, the manual prior art worsens the problem of long design period.

To automate the reduction, Sony Semiconductor Company proposed PASTEL (parameterized memory characterization system). FIG. 3 shows the functional structure and process sequence of the PASTEL.

Reduction by the PASTEL will be explained.

A given SRAM is decomposed into leaf cells serving as units to be repeatedly arranged and connected. Each leaf cell is provided with layout data. According to the layout data of each leaf cell, Arcadia (TM) of Synopsys company, which is a parasitic element extracting program, extracts transistors, parasitic resistors, and parasitic capacitors from each leaf cell. Based on the extracted elements, a SPICE netlist is prepared for each leaf cell.

Separately from this, reduction models are prepared beforehand according to the regularity and design characterization of SRAM cells in case the SRAM cells are loaded. The models are used to carry out pattern matching on the SPICE netlists, thereby providing reduced netlists for the leaf cells, respectively.

A reduction model of memory cells is prepared as shown in FIG. 4. A part shown in FIG. 4(A) is changed into an equivalent circuit of FIG. 4(B). Such equivalent circuits are obtained by multiplying each effective width of transistor by a necessary number of bits.

The reduced netlists prepared for the leaf cells are synthesized into a reduced netlist representing the SRAM as a whole.

The tool of FIG. 3 carries out reduction according to reduced SRAM reduction models, and therefore, is capable of sufficiently reducing the netlist of a given SRAM with an acceptable accuracy. This tool, however, recognizes only given cell patterns, and therefore, is inapplicable to other circuits such as logic circuits. Namely, the tool of FIG. 3 is not versatile and is applicable only to limited circuits.

The tool of FIG. 3 (hereinafter referred to as the first prior art) must have a file of reduction pattern models and is unable to automatically recognize and reduce memory cells from netlists alone.

Since the first prior art employs the pattern matching, one must manually prepare reduction pattern models beforehand and must collate each part of a given circuit with the reduction pattern models. If any part of the given circuit matches with one of the reduction pattern models, the part is replaced with the reduction pattern model.

Manually preparing the reduction pattern models is laborious. The first prior art usually prepares 12 reduction pattern models for memory cells and several tens of reduction pattern models for peripheral control logic parts and must prepare different reduction pattern models for different parameterized memories, i.e., SRAMs and DRAMs for ASICs. These parameterized memories are prepared in different types of architecture for each company.

Namely, the first prior art must prepare many reduction pattern models to design different SRAMs and DRAMs for each type. This is laborious for users. In addition, the pattern matching of the first prior art needs a longer time as the number of patterns increases because the first prior art collates each part of a target circuit with each pattern.

A second prior art is ULTIMA-PR(TM) of Ultima company or STAR-RC(TM) of Avantil company. The second prior art reduces parasitic elements such as parasitic resistors and capacitors of wiring models.

The second prior art reduces only parasitic resistors and capacitors and is unable to reduce transistors. Namely, the second prior art is incapable of providing sufficiently reduced SPICE netlists for large-scale circuits, and therefore, is incapable of simulating large circuits within a practical time.

Netlists prepared by the second prior art are too large to carry out SPICE simulation, need a lot of computer resources, or take a long processing time, e.g., one week or over.

As mentioned above, the prior arts need a long reduction time and are unable to provide netlists sufficiently small for simulators. The prior arts are applicable only to limited circuits and elements, and therefore, are not versatile. When designing large-scale circuits, the prior arts frequently require computer resources exceeding an available hardware quantity, thereby failing simulation.

SUMMARY OF THE INVENTION

The present invention has been made to solve the above problems of the prior arts such as a long reduction time, inaccurate reduction, insufficient reduction, and limited application.

An object of the present invention is to provide a method of reducing circuit data to be simulated, by extracting element data that influences a result of simulation out of the circuit data, thereby shortening a simulation time while maintaining the accuracy of simulation.

Still another object of the present invention is to provide a method of reducing circuit data to be simulated only according to the characteristics of MOS transistors, thereby making the method versatile.

Still another object of the present invention is to provide a method of simulating a circuit by extracting element data that influences a result of simulation out of the circuit, preparing a reduced circuit from the extracted data, and using the reduced circuit for simulation, thereby shortening a simulation time while maintaining the accuracy of simulation.

Still another object of the present invention is to provide a computer readable medium for storing a circuit reduction program for extracting element data that influences a result of simulation out of given circuit data and preparing reduced circuit data from the extracted data, thereby shortening a simulation time while maintaining the accuracy of simulation. Also provided is a computer readable medium for storing a simulation program for simulating a given circuit according to the reduction method of the present invention.

To accomplish the objects, the present invention finds a range in which an input signal propagates and this propagation influences an observation point in a given circuit according to the characteristics of MOS transistors and extracts nodes and elements from the range. According to the extracted nodes, the present invention reduces the given circuit. This technique is applicable to a wide variety of integrated circuits.

Elements contained in a circuit to be reduced and simulated are not only MOS transistors but also resistors, capacitors, inductance elements, control power sources, and diodes. Circuit data for a given circuit to be reduced and simulated includes data about elements, nodes, and connections among them.

An example of the reduction method of the present invention is shown in FIG. 5. The method consists of steps S10 to S50. Step S10 receives at least an input vector and/or an observation point for circuit data to simulate. Step S20 sequentially develops the potential state of each node which is in the circuit data and whose potential must be fixed, according to information about fixed-potential nodes and/or initial node values, the information about fixed-potential nodes being obtained from input vectors that activate a route for transmitting an input signal, the initial node values being contained in the circuit data. Step S30 groups nodes according to MOS transistor channels that connect the nodes to one another, and forms an oriented graph from a node group on the gate side of a MOS transistor toward a node group on the channel side of the MOS transistor. Step S40 extracts node groups on a path between an input node at which the state of an input vector varies and an observation node, according to the oriented graphs. Step S50 extracts nodes from the extracted node groups and elements connected to the extracted nodes.

Step S20 may find nodes whose potential is fixed during simulation in the circuit data according to the input vector, and according to the found nodes, determine the ON/OFF state of each MOS transistor whose gate potential is fixed. Step S30 may group nodes according to the ON/OFF states of the MOS transistors. Step S40 may extract nodes from an input signal path between a node group on the gate side of a MOS transistor and a node group on the channel side of the MOS transistor.

This configuration extracts essential data that influences a result of simulation from given circuit data, thereby securing the accuracy of simulation, reducing the size of the circuit to be simulated, and shortening a simulation time.

The simulation method of the present invention simulates the characterization such as timing, functions, consumptive power, and noise of a circuit. This method reduces the circuit to simulate according to the characteristics of MOS transistors contained in the circuit. The method is capable of reducing a variety of circuits including SRAMs, logic circuits, and other circuits.

The method may include the step of deleting at least one of resistors, capacitors, inductance elements, control voltages, and diodes connected to MOS transistors that are not extracted from circuit data. This technique allows not only transistors but also elements such as resistors, capacitors, inductance elements, control voltages, and diodes connected to the transistors to be reduced.

Circuit data handled by the present invention may be circuit data before layout, circuit data after layout, or printed circuit data. The present invention shortens a simulation time in each of circuit designing stages.

Step S10 may optionally specify sub-circuits that must be left in reduced circuit data. This function excludes parts that may cause errors in simulation if reduced or omitted, from parts to be reduced, thereby securing the accuracy of simulation.

Steps S10 and S50 may be carried out on a circuit diagram graphically displayed on a screen. The graphical I/O function enables one to visually enter circuit data, thereby speeding up data input and output operations, reducing input mistakes, and enabling users to visually check reduced circuit parts.

Step S20 may specify the potential state of an arbitrary node in given circuit data and fix the potential states of other nodes according to the specified potential state and input vectors.

Step S40 may control the range of reduction according to the number of stages of load elements entered by user. This technique enables designers to compare and consider simulation accuracy.

Various further and more specific objects, features and advantages of the present invention will appear from the description given below, taken in connection with the accompanying drawings illustrating by way of preferred embodiments of the present invention.

BRIEF DESCRIPTION OF THE DRAWINGS

FIG. 1 is a flowchart showing steps to design an LSI;

FIG. 15 shows an example of a SPICE netlist to be reduced according to the present invention;

FIG. 16 shows a SPICE netlist reduced from the netlist of FIG. 15 according to the present invention;

FIG. 17 shows the contents of a log file provided by the reduction method of the present invention;

FIG. 26 shows a net list to be reduced according to the first embodiment of the present invention, for a comparison purpose to explain a fourth embodiment of the present invention;

DETAILED DESCRIPTION OF THE EMBODIMENTS

First embodiment

The details of the first embodiment of the present invention will be explained with reference to the drawings.

The first embodiment reduces, as an example, compilable cells of an ASIC so that the reduced data is used for simulating the read and write timing characteristics of the memory.

Figure 2A:
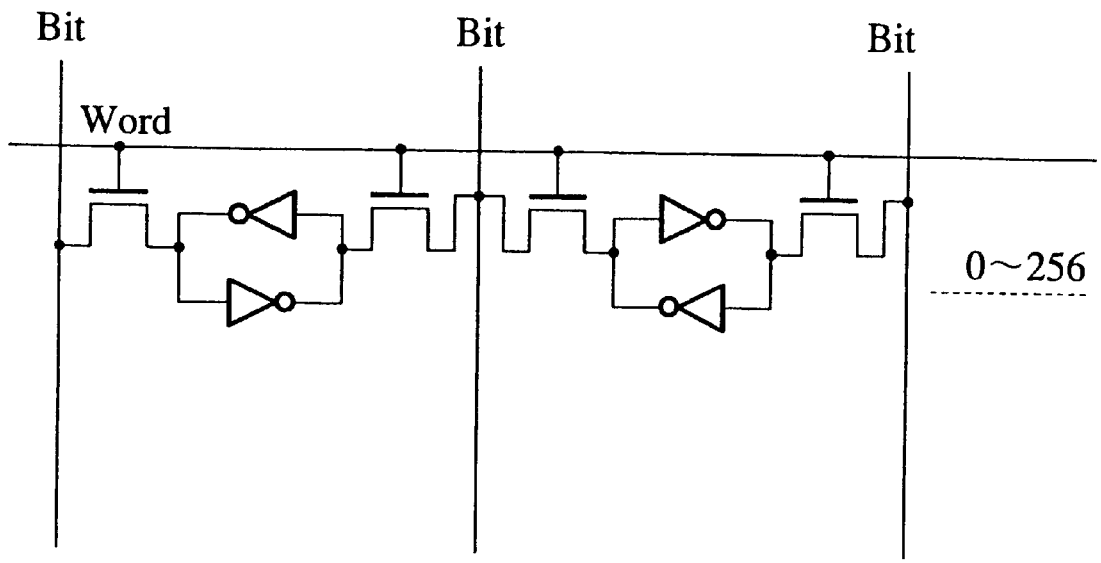
FIGS. 2A and 2B show an example of manual circuit reduction.
Figure 2B:
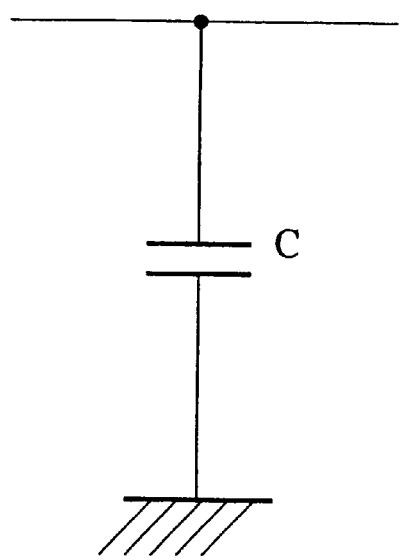
Figure 3:
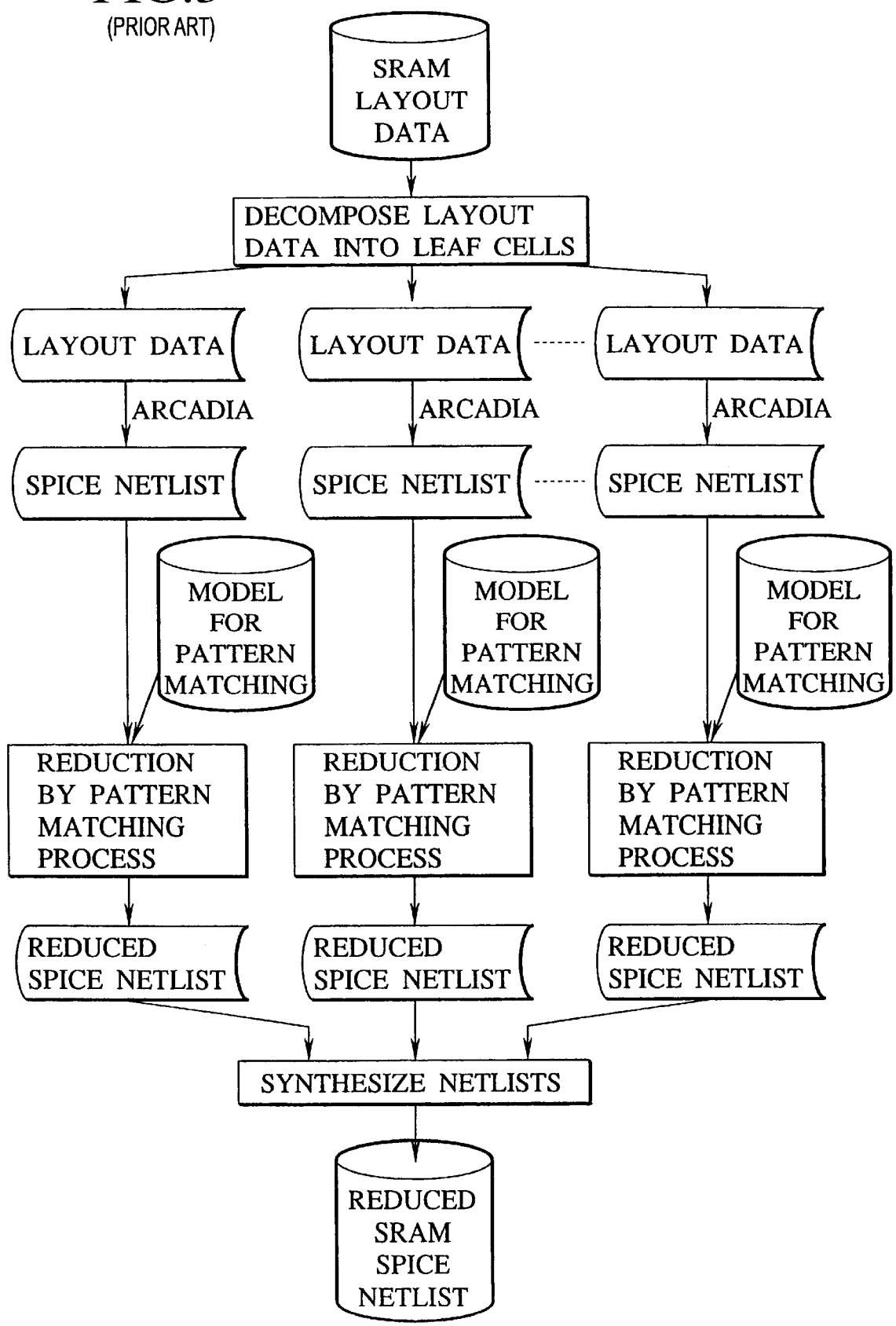
FIG. 3 shows a circuit reduction procedure according to a prior art.
Figure 4A:
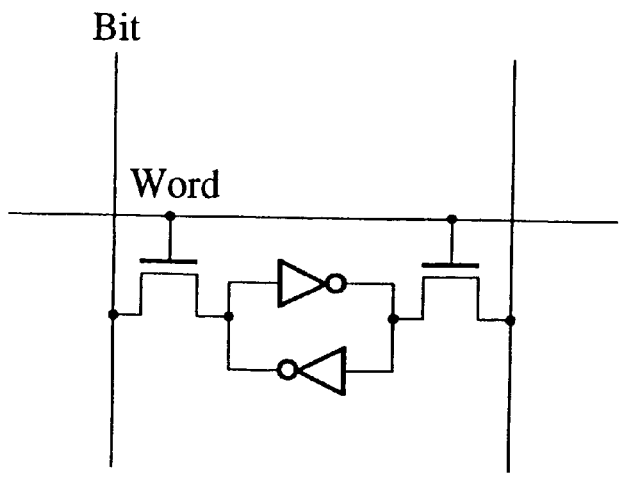
FIGS. 4A and 4B show a memory cell before and after reduction according to the prior art of FIG. 3.
Figure 4B:
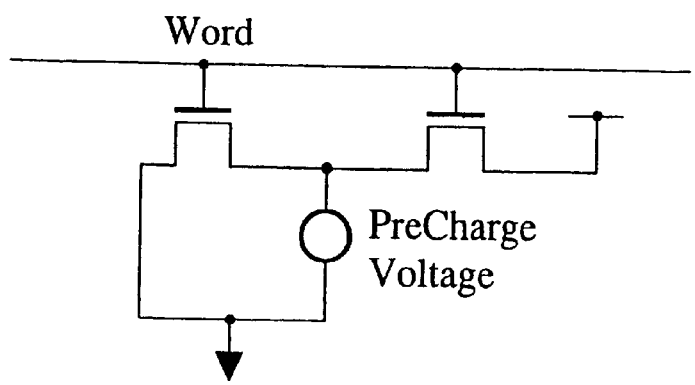
Figure 5:
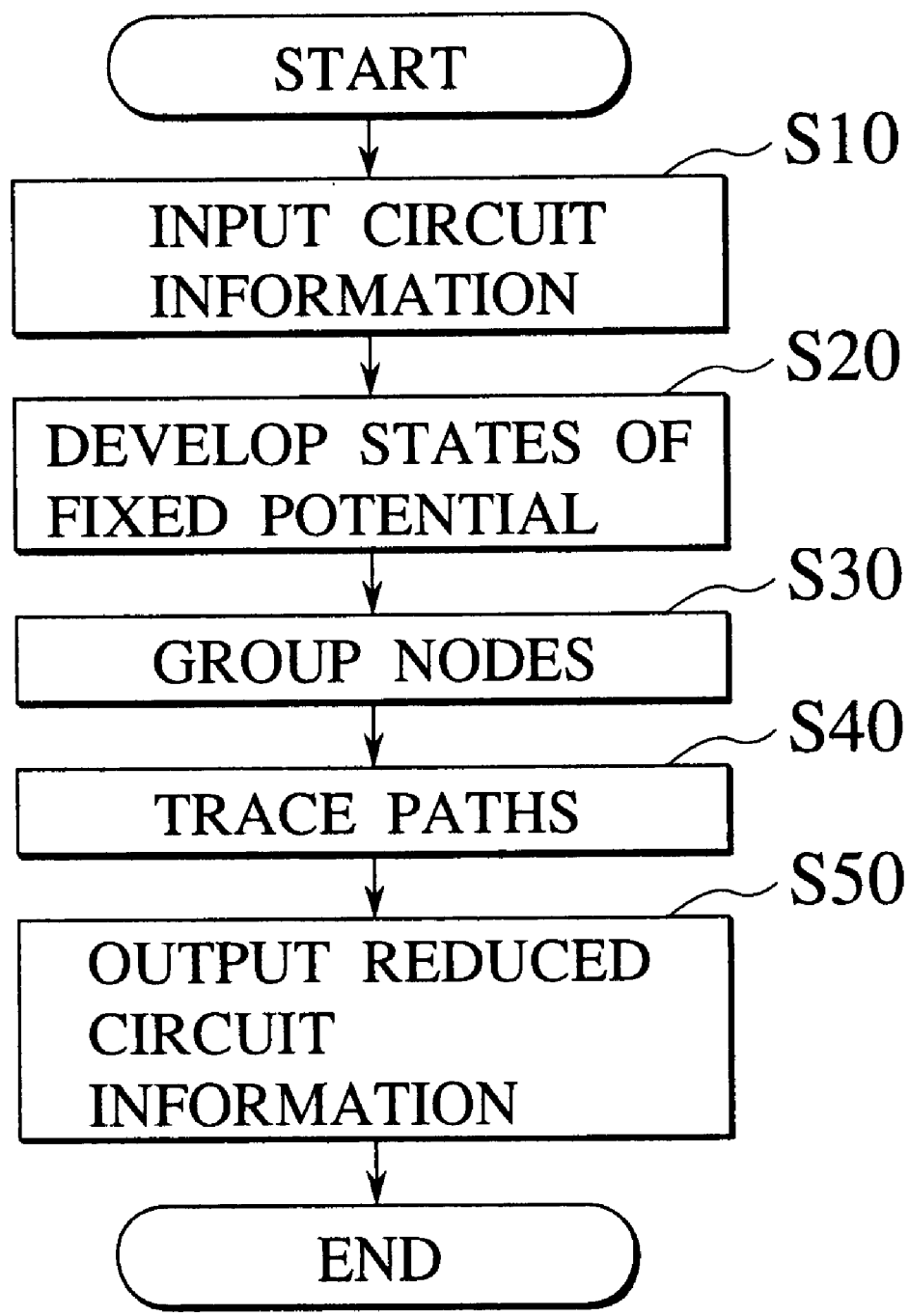
FIG. 5 is a flowchart showing a circuit reduction algorithm according to a first embodiment of the present invention.

FIG. 5 is a flowchart showing a circuit reduction algorithm according to the first embodiment.

Step S10 receives circuit data such as a SPICE netlist to be reduced. Step S20 finds, in the circuit data, input nodes whose potential states are fixed by independent source voltages, and starting from these nodes, finds nodes whose potential states can be fixed. The found nodes are fixed to a high or low potential state.

The circuit data received in step S10 may be of an integrated circuit before or after layout, or of a printed circuit.

Step S30 groups nodes contained in the circuit data such as netlist. Step S40 uses these node groups as units and finds groups that are in a path between an input node whose potential varies and an observation node. Step S50 provides reduced circuit data prepared from nodes and elements extracted from the found groups.

Principles of the first embodiment will be explained.

Figure 6:
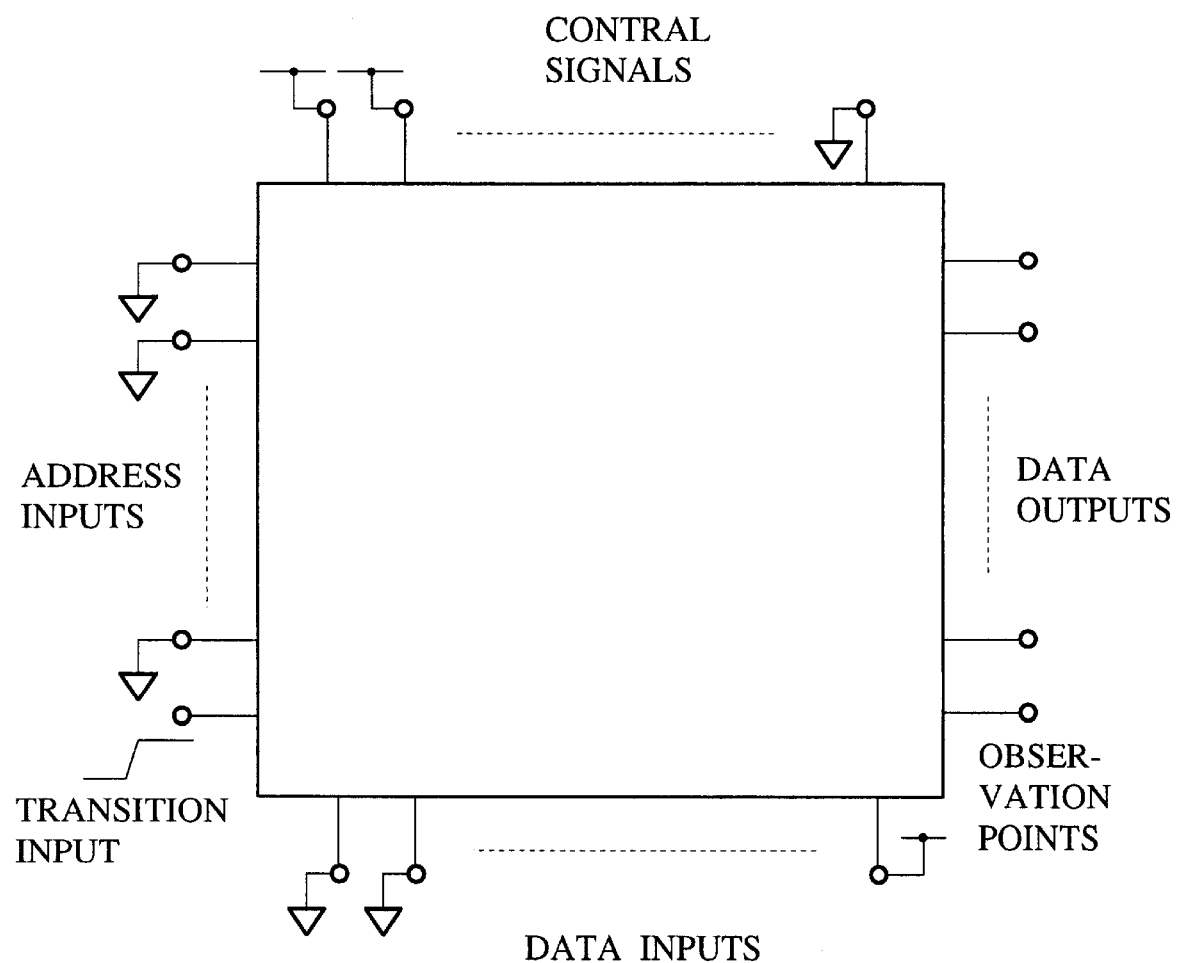
FIG. 6 shows settings for simulating the timing characteristics of a memory according to the first embodiment.

Simulation of the read and write timing characterization of an ASIC memory is carried out by, for example, changing the potential of an input address bit and evaluating a time when the change is observed in the potential of an output data bit, as shown in FIG. 6.

For this sort of simulation, proper input vectors and observation nodes must be specified similar to the case of standard dynamic simulation. Namely, critical paths must be clarified beforehand. Generally, an input address that involves a longest access time is selected to determine a critical path, and an output data bit that involves a longest delay is selected as an observation point.

Reducing a given circuit into a reduced circuit to be simulated is carried out through first and second procedures.

Figure 7A:
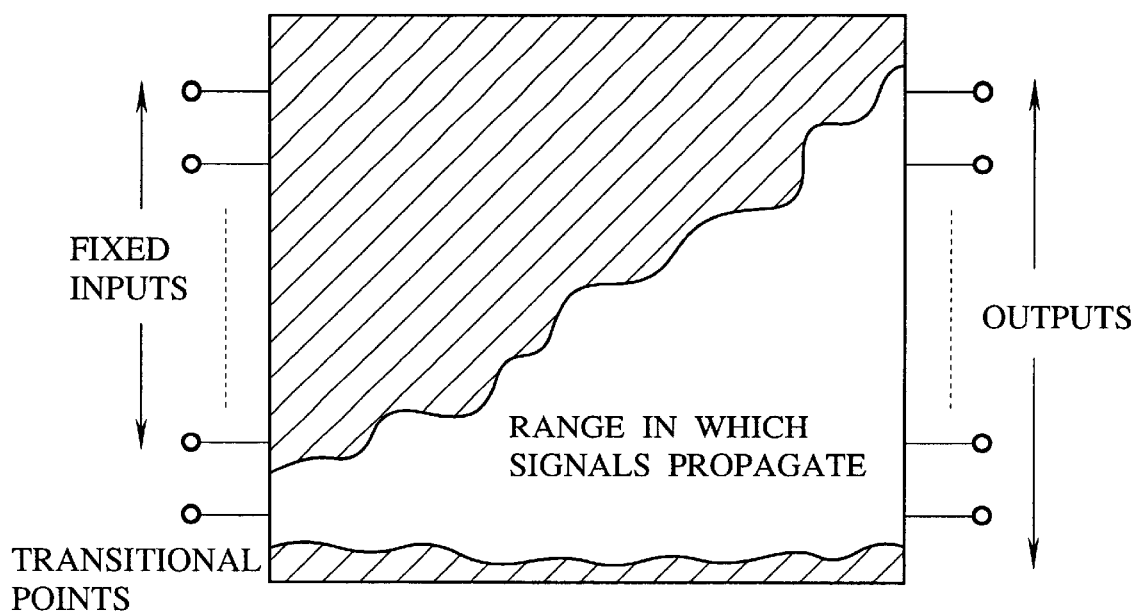
FIGS. 7A and 7B show reduction principles according to the present invention.

The first procedure defines in the circuit a range in which a change in an input signal is propagated. Any node that receives no influence of the input change maintains fixed potential, and therefore, there is no need of simulating such nodes. Consequently, such nodes are deleted from the given circuit without affecting a result of simulation. Hatched parts in FIG. 7(A) represent the parts to be deleted from the given circuit. This deletion must be carried out only in a steady state at the start of simulation. If the circuit includes unstable parts such as oscillators that are not steady at the start of simulation, another measure must be taken. This will be explained later in connection with step S20.

Figure 7B:
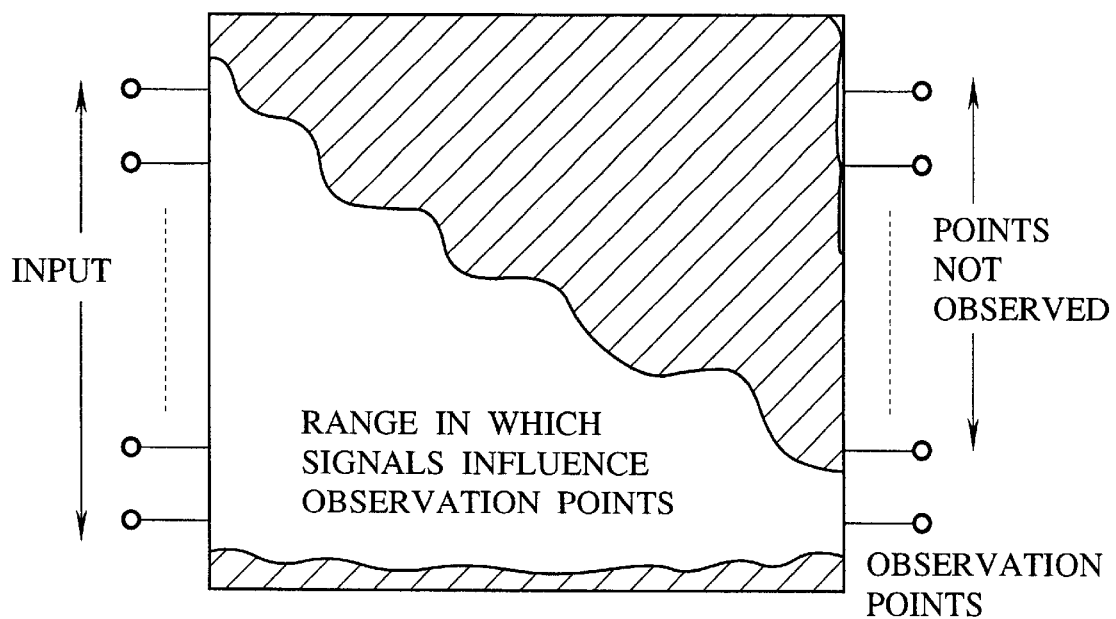

The second procedure determines parts that give no influence on the observation point even if the parts operate. These parts are excluded as hatched parts shown in FIG. 7(B).

According to these principles, the first embodiment reduces circuit data to be simulated.

Figure 8:
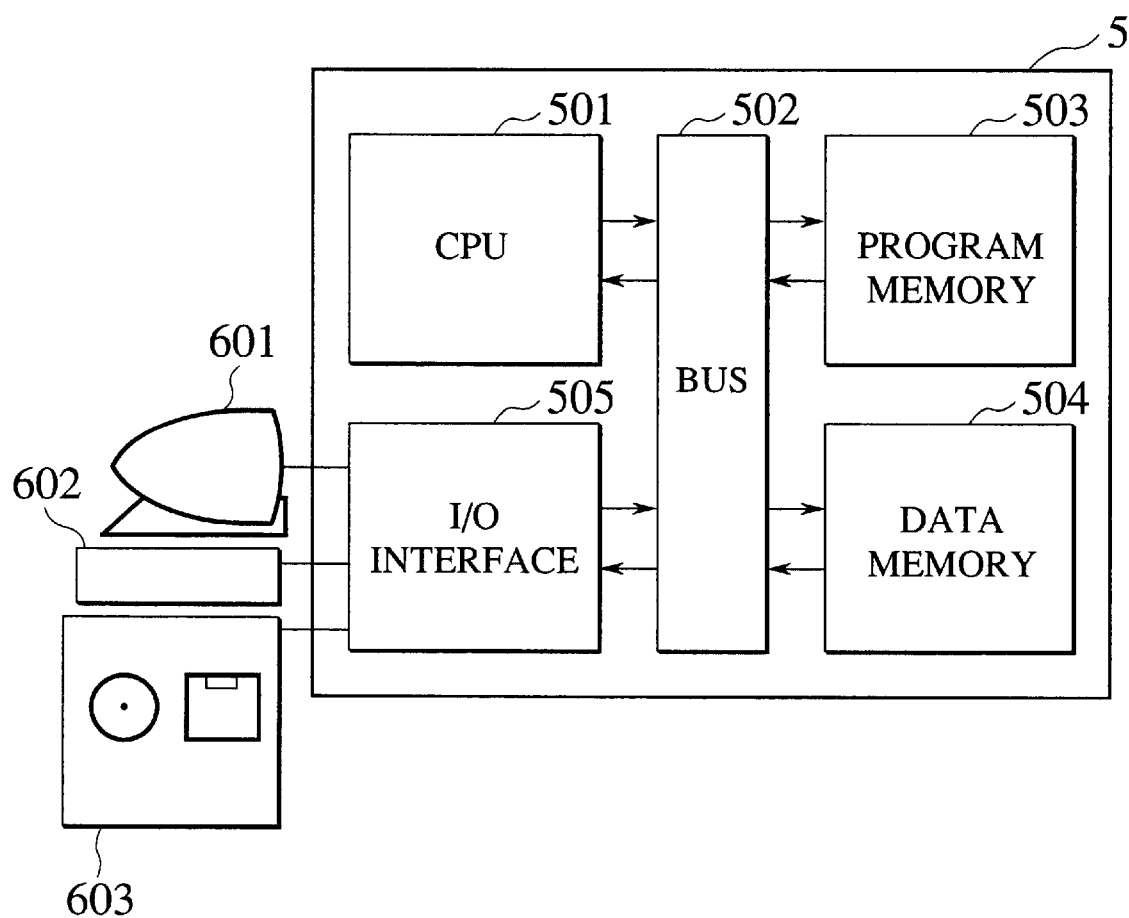
FIG. 8 shows a hardware configuration according to the present invention.

FIG. 8 shows a hardware configuration for achieving the present invention.

A computer system 5 to achieve the present invention may be a workstation, a personal computer, or a network terminal.

The computer system 5 includes a CPU 501 for carrying out various processes, a program memory 503, a data memory 504, an I/O interface 505, an external storage unit 602 such as an FD drive and a CD drive, and an input/output unit 601 including a keyboard, a mouse, a display, and a printer. A bus 502 connects these parts to one another.

A program for realizing the reduction method of the present invention may be stored in a recording medium 603. The computer system 5 reads the recording medium 603 and executes the program to achieve the present invention. The recording medium 603 may be a memory, a magnetic disk, or an optical disk.

The reduction algorithm of FIG. 5 of the first embodiment will be explained in detail.

Figure 9:
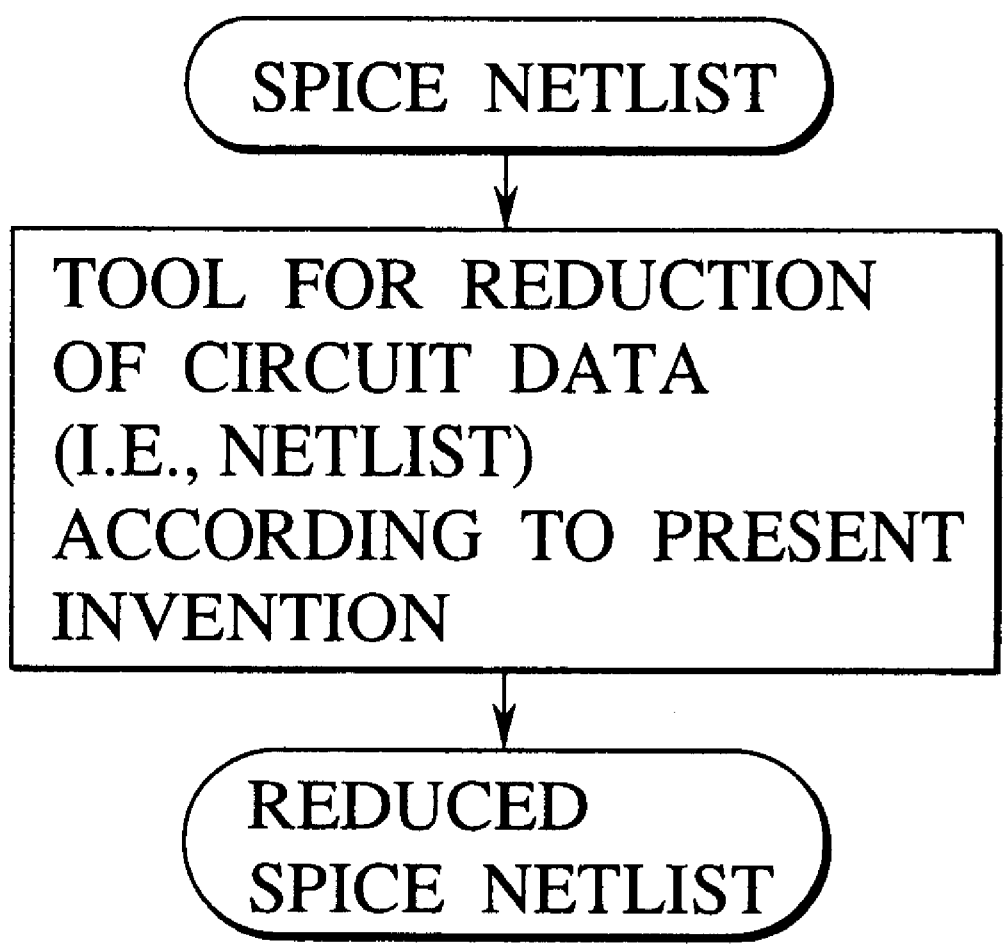
FIG. 9 shows a relationship between input and output data reduced by the present invention.

Step S10 reads circuit data such as a SPICE netlist to be reduced and simulated. The first embodiment reduces the entered SPICE netlist into a reduced netlist as shown in FIG. 9. The entered netlist must have a description about external inputs such as source voltages and a description about observation points (".PRINT" statement) and must be able to be simulated.

The external inputs and observation points are specified by users through some means. Generally, an address that is considered to involve the longest access time is selected as an input address, and an output data bit that is considered to involve the longest delay is selected as an observation point.

FIG. 1 shows steps to design an LSI. The reduction method of the present invention is used in various steps of FIG. 1. A circuit diagram editor prepares schematic data, and according to which, step S110 provides a SPICE netlist and step S120 carries out simulation based on the reduced netlist. Step S140 prepares a layout including capacitors and resistors, and a SPICE netlist is made accordingly. Step S160 carries out simulation based on the netlist. In this way, the circuit simulator such as the SPICE and the PowerMIll (TM) of Synopsys company is used in various design steps.

Accordingly, the reduction method of the present invention is useful in many circuit design stages as a preprocessor to reduce a netlist for the simulators.

The reduction method of the first embodiment picks up essential data from a standard SPICE netlist and prepares a reduced netlist according to the essential data. Consequently, If the original netlist contains data about external inputs and observation points for simulation, the first embodiment can reduce the netlist without new data to be entered.

The developing of fixed states to nodes carried out in step S20 (FIG. 5) of the first embodiment is to find nodes that are fixed at a potential level of VDD or VSS during simulation. More precisely, step S20 finds and extracts every node whose potential is fixed at a certain level during simulation according to an initial state given in SPICE netlist or potential-fixed input nodes, and attaches a label of high or low potential state to the node.

A potential-fixed node is directly connected to a ground (GND) or a DC voltage source. Any element whose terminals are all connected to potential-fixed nodes is deleted from the netlist because such element gives no influence on simulation.

After deleting all such unnecessary elements, a range in which a varying in an input signal is propagated is selected as shown in FIG. 7(A).

The first embodiment does not treat unstable circuits such as oscillators and reference potential generators for generating intermediate potential in stable state.

Potential levels set for elements include VDD, VSS, and intermediate potential. The intermediate potential may be given with a control command for input circuit data, to reduce even analog elements such as sense amplifiers contained in the circuit data.

Rules for developing states to nodes will be explained. These rules are employed in an optional sequence.

(a) A node directly connected to a DC voltage source such as an external input terminal or a power source terminal is labeled as VDD or VSS.
(b) An NMOS whose gate is at VSS is labeled as OFF.
(c) A PMOS whose gate is at VDD is labeled as OFF.
(d) A PMOS whose source is at VDD and gate at VSS is detected. If there is an OFF transistor in any DC path between a drain node of the PMOS and VSS, the drain node is labeled as VDD.
(e) An NMOS whose source is at VSS and whose gate at VDD is detected. If there is an OFF transistor in any DC path between a drain node of the NMOS and VDD, the drain node is labeled as VSS.

Figure 10A:
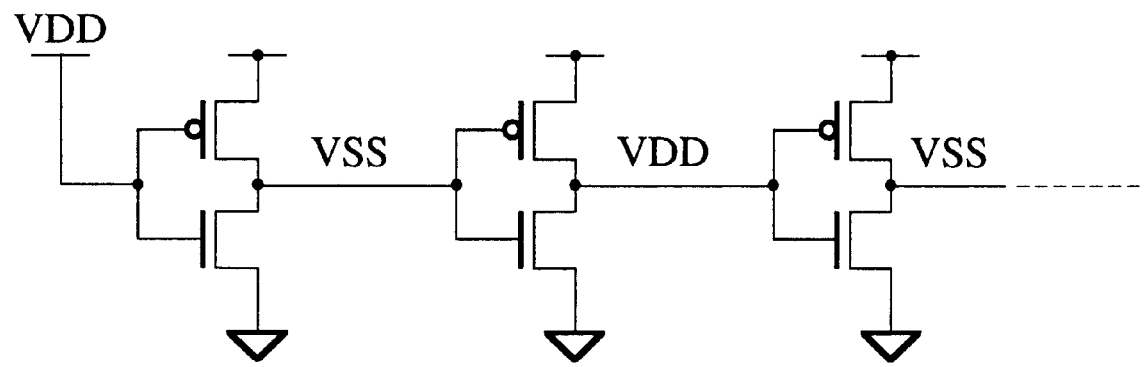
FIGS. 10A and 10B show a development of fixed potential to nodes according to the present invention.
Figure 10B:
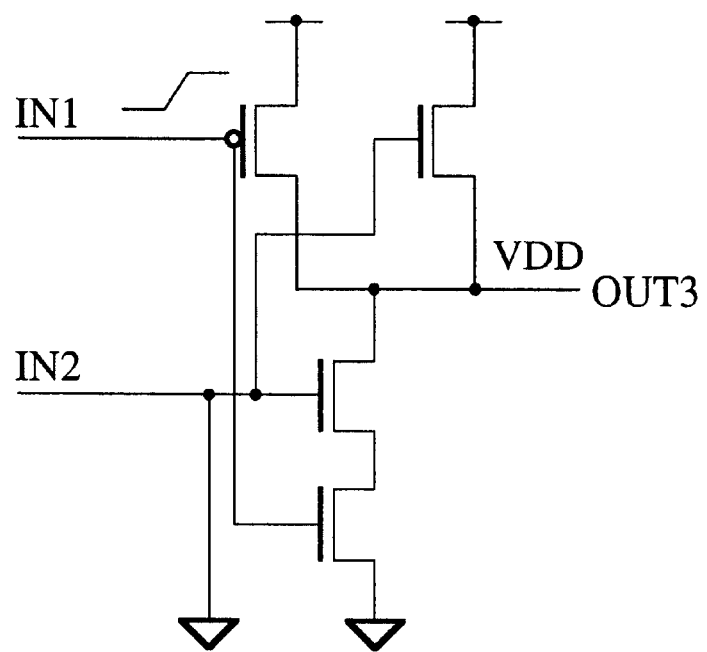

Examples are explained. In FIG. 10(A), an input terminal is fixed at VDD, and therefore, elements are sequentially labeled as VSS, VDD, and the like. In FIG. 10(B), an input IN1 varies. Even such a varying, an input IN2 is fixed at VSS, and therefore, a node OUT3 is fixed at VDD. A resistance element is always handled as an ON transistor.

Step S30 of FIG. 5 groups nodes. Each group contains nodes that are connected to one another through MOS channels. Resistors, inductance elements, etc., may be included in the node groups. A boundary between node groups is formed by OFF MOSs. The grouping of nodes is equal to expressing relationships among node groups with a graph of oriented branches. Each oriented branch extends from a gate-side node group to a channel-side node group. No branch is extended over an OFF MOS because nodes on each side of the OFF MOS are irrelevant to simulation. Node groups are separated from each other on the channel and gate sides of a MOS, and the channel-side group is traced from the gate-side group according to the oriented graph.

Based on the oriented graph prepared in step S30, step S40 traces node groups along a path extending from an input node where input potential varies to an observation node.

The path tracing extracts nodes that influence the observation node in simulation, based on an assumption that an influence is given from the gate of a MOS to the source and drain thereof and no influence is given in the opposite direction.

Consequently, all node groups existing on the path between the input terminal and the observation point are picked up.

The path tracing will be explained with reference to the flowchart of FIG. 11.

Step S41 determines that a node group that includes the observation node is reachable from the input end where input potential varies. Step S42 determines if there is a node group that has an oriented branch toward the reachable node group. If true, step S43 determines that the second node group is reachable from the input end. Step S44 repeats steps S42 and S43 on every node group to extract all reachable node groups. Step S45 extracts all nodes contained in the reachable node groups. Step S46 picks up all elements connected to the extracted nodes.

Step S47 finds nodes that are connected to the extracted elements and are not contained in the reachable node groups, and then, finds elements connected to the nodes thus found. Among the found elements, step S47 connects NNOSs to VSS and PMOSs to VDD. The extracted elements and nodes form a reduced netlist.

MOS transistors that are not included in the reduced netlist are reduced or omitted elements.

At this time, elements such as resistors, capacitors, inductance elements, control power sources, and diodes that are connected to the reduced transistors are also reduced.

The path tracing may be carried out from an output observation point toward a node where input potential varies, or from the node where input potential varies toward the output observation point, vice versa.

The path tracing will be explained in detail with reference to FIGS. 12 and 13.

Figure 11:
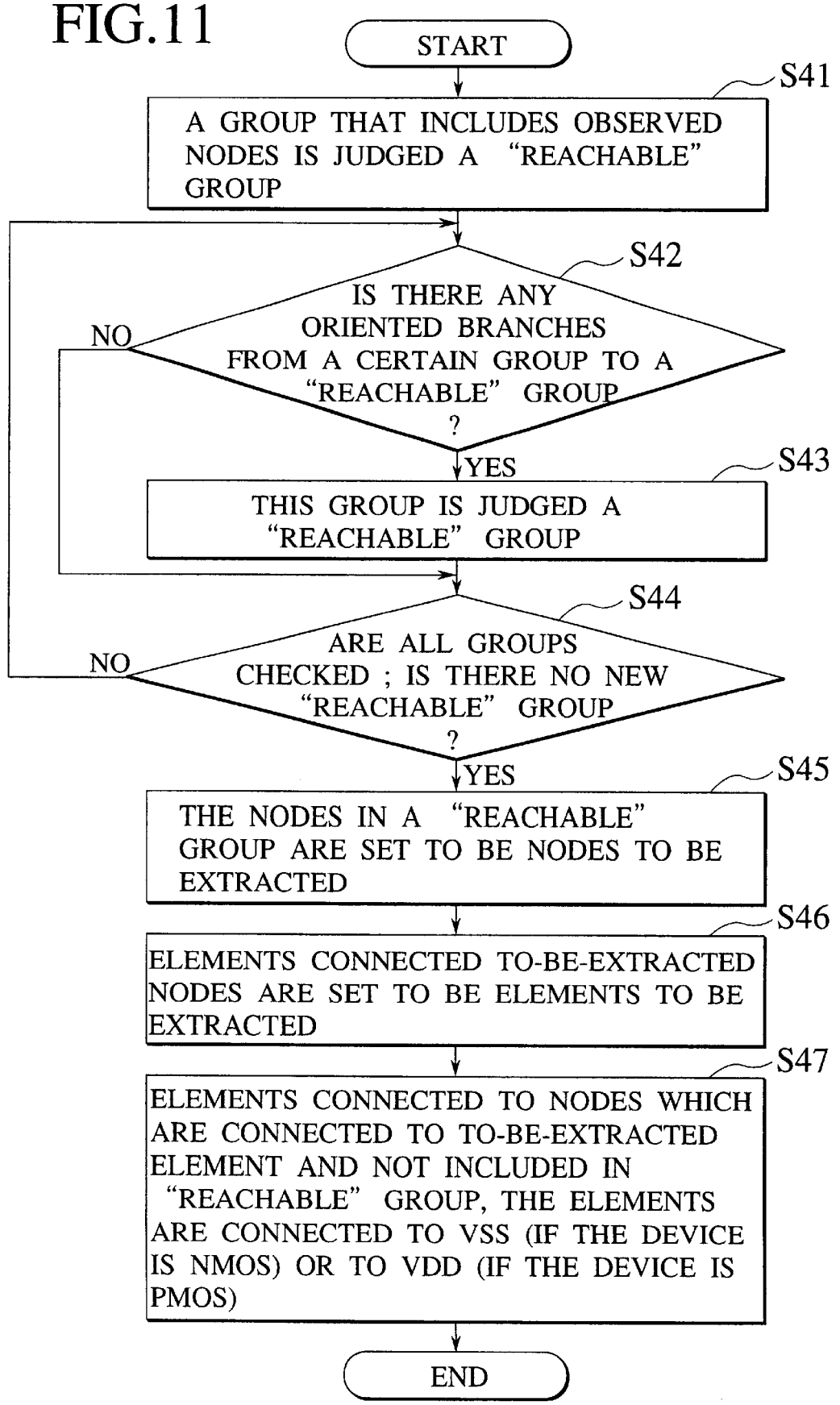
FIG. 11 is a flowchart showing a path tracing algorithm according to the present invention.
Figure 12:
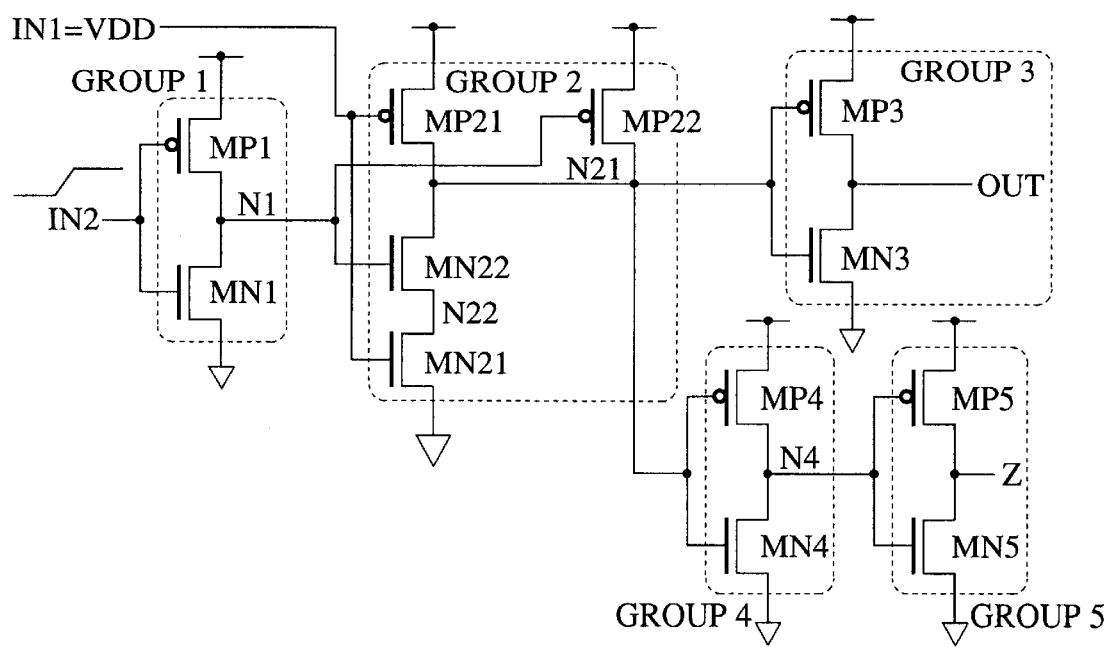
FIG. 12 shows an example of the grouping of nodes according to the present invention.
Figure 13:
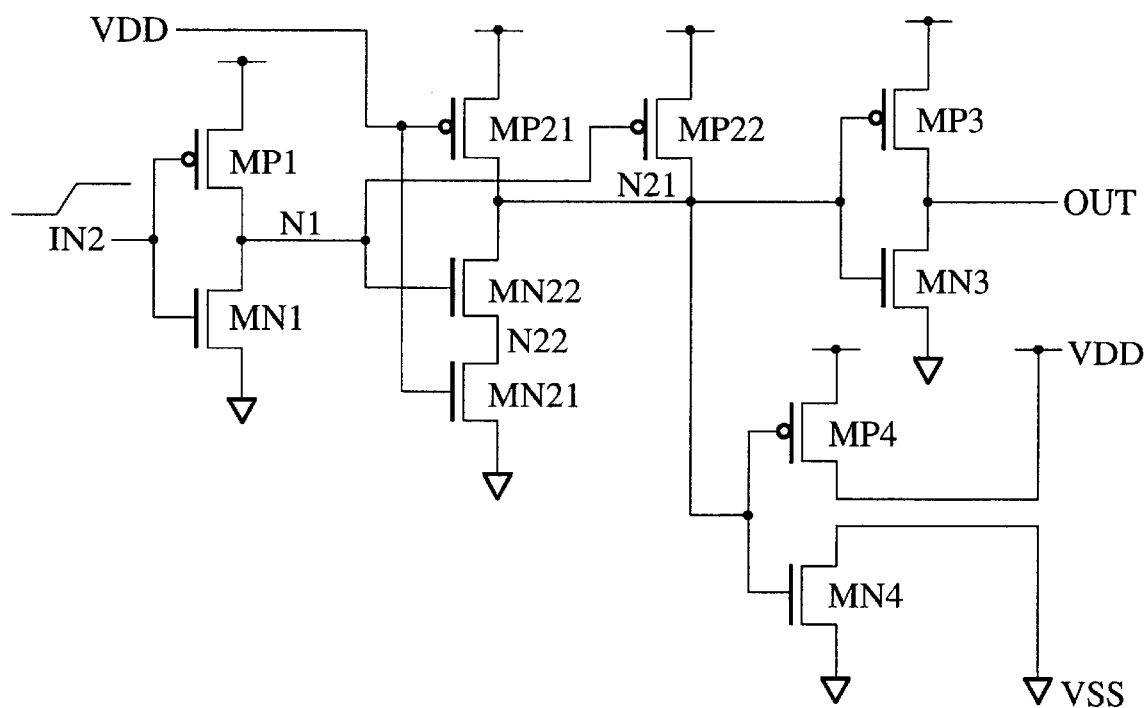
FIG. 13 shows an example of a result provided by the flowchart of FIG. 11.

In FIG. 12, a node OUT is an observation node. Accordingly, step S41 of FIG. 11 determines that a node group 3 that contains the node OUT is reachable from an input node whose potential changes. Steps S42 and S43 determine that node groups 2 and 1 are reachable from the input node. Step S45 extracts nodes OUT, N21, N22, N1, and IN2 contained in the reachable node groups. Step S46 extracts elements MP3, MN3, MP4, MN4, MP21, MP22, MN21, MN22, MP1, and MN1 connected to the extracted nodes. Step S47 connects the drain nodes of the elements MP4 and MN4 to VDD and VSS, respectively because these nodes are not picked up. Consequently, a reduced circuit shown in FIG. 13 is formed from the extracted parts.

Figure 14A:
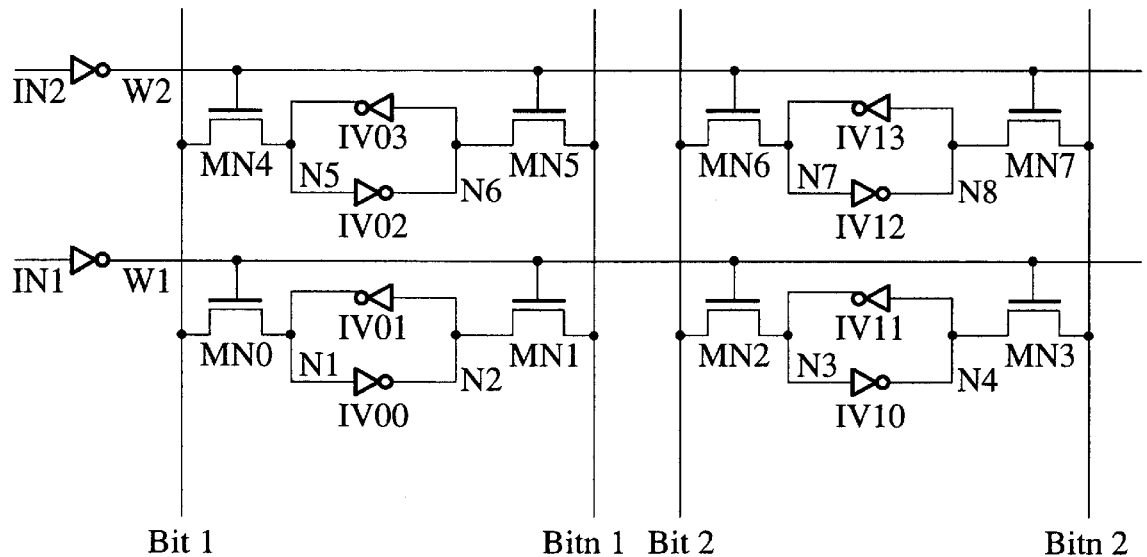
FIGS. 14A and 14B show and example of reduction carried out on an SRAM according to the present invention.
Figure 14B:
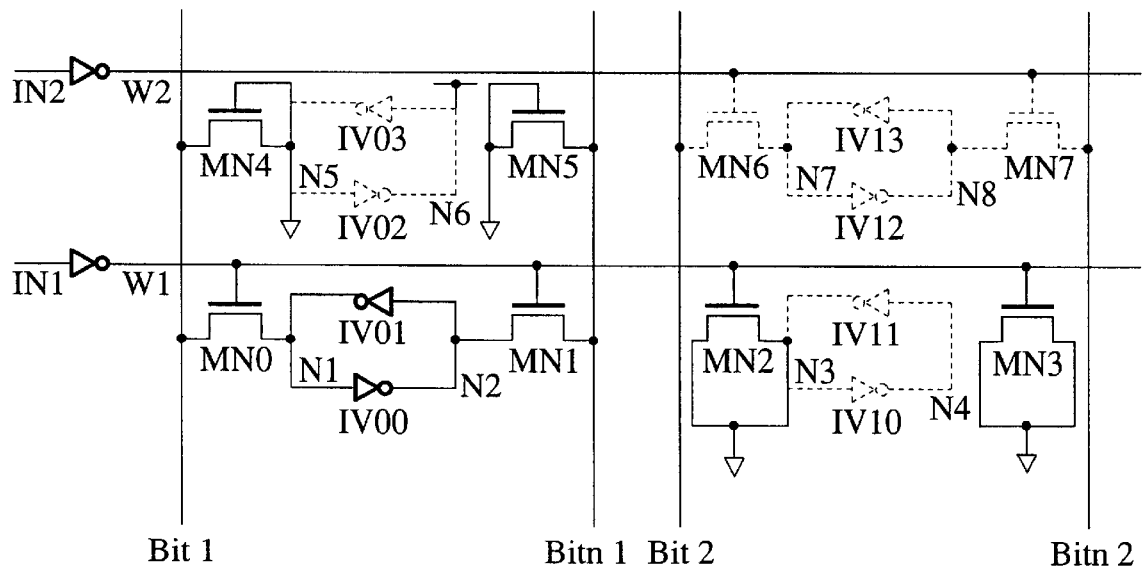

FIG. 14 shows a part of an SRAM to be reduced, in which FIG. 14(A) shows a 2×2 memory cell core before reduction and FIG. 14(B) shows the same part reduced according to the first embodiment. In FIG. 14(A), word lines receive input signals IN1 and IN2 through inverters. The input signal IN1 varies from high to low to read data from a memory cell. The other input signal IN2 is fixed at high. Observation nodes are on BIT1 and BITN1.

In FIG. 14(A), no input signal varying propagates in the unselected word line. Accordingly, the unselected word line and memory cells connected thereto are reduced, i.e., deleted. Also, bit lines that are not observed give no influence on the observation nodes. Consequently, such bit lines and memory cells and sense amplifiers connected thereto are deleted.

In FIG. 14(A), the word line W1 receives a change in the input signal IN1, and the bits b1 and bn1 are observed. As a result, nodes surrounded with continuous lines and elements connected to these nodes are extracted according to the first embodiment, and the others are deleted as shown in FIG. 14(B). The reduction rules mentioned above are applicable not only to memory cells that are regularly arranged but also to peripheral circuits such as predecoders.

In the examples of FIG. 14, the reduction rules of the first embodiment reduce the number of transistors from 28 to 12. The elements MN0 and MN1 and inverters IV00 and IV01 are extracted as a 6-transistor basic cell. The gate input terminals of the elements MN4 and MN5 are fixed at VSS, and the source and drain of the element MN2 are fixed at VSS. The source and drain of the element MN3 are fixed at VSS.

The reduction technique of the first embodiment on the SRAM of FIG. 14 will be explained in connection with input and output netlists.

FIG. 15 shows the input netlist handled by the first embodiment. Input vectors specify independent source voltages IN1 and IN2 as indicated with L1. The source voltage IN1 varies as time passes, i.e., 3.3 volts at time 0, 3.3 volts at time 2n, 0 volts at time 2.38n, and 0 volts at time 5. On the other hand, the source voltage IN2 is fixed at 3.3 volts. Any source voltage such as IN2 fixed at low or high potential is a start point for the state development of step S20 of FIG. 5. Any source voltage such as IN1 that temporally varies is specified by PWL (piece wise linear) or PULSE.

A statement ".SUBCKT" indicated with L2 is the definition of a sub-circuit which is, in FIG. 15, a circuit IV having input terminals A and Z. For example, a circuit "XIV00" has terminals N1, N2, and 1.

MN0 to MN7 indicated with L3 are MOSFETs which are, in FIG. 15, NMOS transistors. Second to fourth columns following a label of, for example, MN0 are drain, gate, and source terminals. L and W that follow represent the length and width of the transistor.

A statement ".IC" indicated with L4 is a potential value at a node at time 0.

A statement ".PRINT" indicated with L5 specifies observation nodes which are, in FIG. 15, W1, BIT1, and BITN1.

A statement ".MODEL" describes the characteristics of NMOS and PMOS transistors as indicated with L6 and L7.

FIG. 16 shows a netlist reduced from the netlist of FIG. 15 according to the first embodiment. For nodes remaining after the reduction, statements ".IC," ".SAVE," ".PRINT," etc., are prepared as indicated with L8. Transistors are developed flat as indicated with L9.

A user may specify arbitrary sub-circuits to be excluded from reduction.

Figure 18:
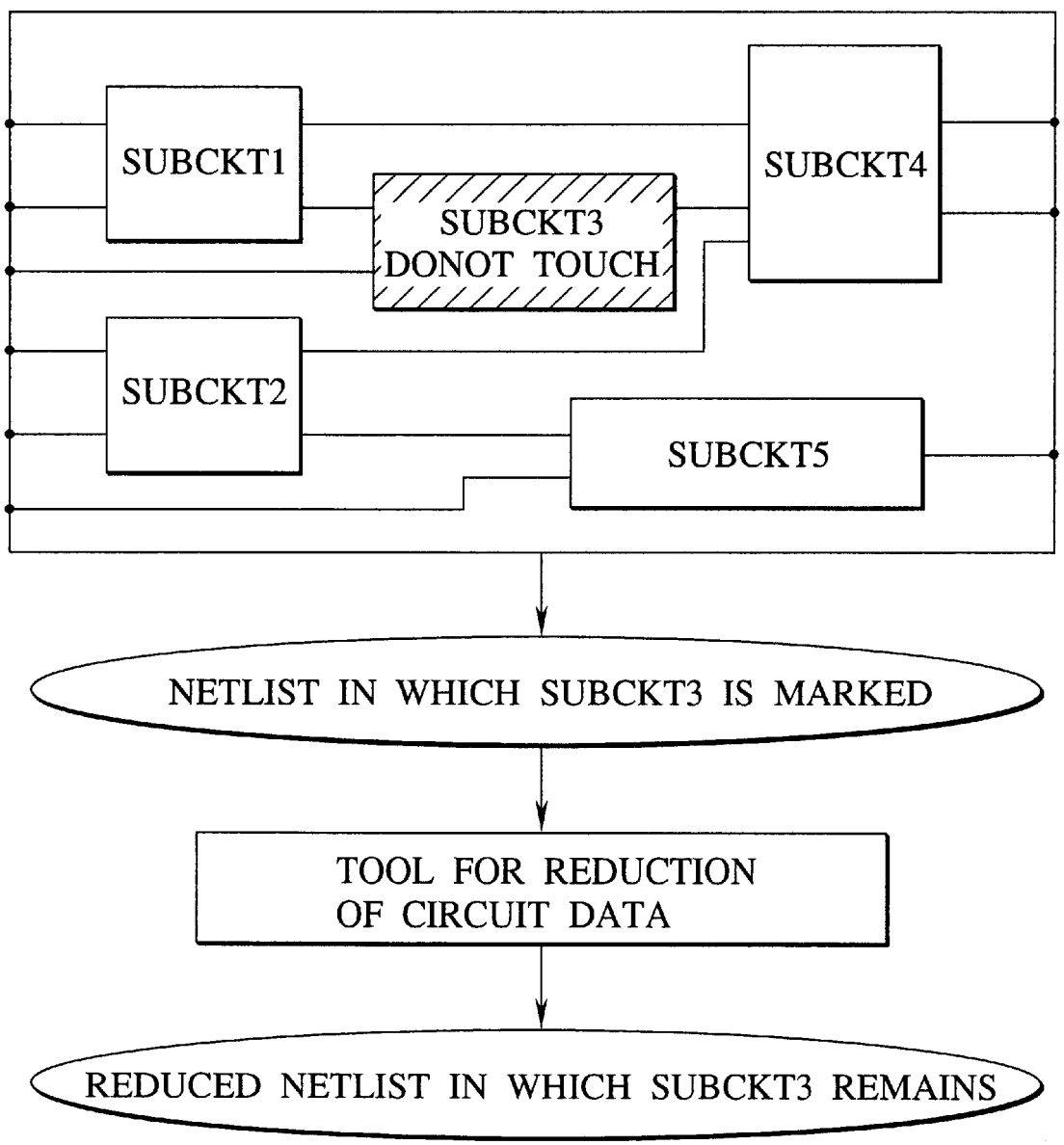
FIG. 18 shows a sub-circuit excluding function according to the present invention.

For example, as shown in FIG. 18, a user may specify a sub-circuit SUBCKT3 on a netlist or a circuit diagram to exclude it from reduction. The specified sub-circuit is provided with an indication of "DO NOT TOUCH" as shown in a hatched area of FIG. 18 and is excluded from reduction. Namely, the sub-circuit SUBCKT3 is picked up and left as it is in a reduced netlist. This exclusion is made before or during step S10 of FIG. 5.

For example, analog sub-circuits in a constant current circuit may be excluded from reduction to improve the accuracy of simulation to be carried out on a reduced netlist. If a certain sub-circuit must be included in circuit data to be simulated, the given sub-circuit must be excluded from reduction.

FIG. 17 shows a log file used by the first embodiment to record reduction conditions. The log records the numbers of input nodes and observation nodes as indicated with L10 and L11. The log also records the numbers of nodes before and after reduction as indicated with L12. Also recorded are the numbers of MOSFETs, resistors, and capacitors before and after reduction as indicated with L13, and a processing time and a memory capacity used for reduction as indicated with L14 and L15.

Recent tools for designing ASIC compilable cells are capable of preparing a layout of RAMs and ROMs once a user enters the numbers of words and bits. The compilable cells thus prepared must be simulated and rearranged so that they provide maximum performance. At this time, conventional simulators such as the SPICE are incapable of simulating large-scale compilable cells within a practical time and need a large amount of computer memories.

Then, the first embodiment of the present invention prepares a reduced SPICE netlist that will not deteriorate the accuracy of simulation. The reduced SPICE netlist includes the minimum numbers of transistors, capacitors, and resistors needed for simulating the characteristics of large compilable cells as a whole. A memory usually includes regularly arranged parts, and therefore, a designer can specify input vectors to activate critical paths of the memory. According to the input vectors and observation nodes, the first embodiment finds and selects information necessary for dynamically simulating the characteristics of the memory.

Quantitative effects of reduction on an SRAM by the first embodiment will be explained.

The first embodiment reduces the number of elements in a SPICE netlist to about ⅓ to ½₀₀₀.

Such reduction shortens a SPICE simulation time to a fraction of or some hundredths of a usual simulation time. Very large SRAMs of ASIC compilable cell that are usually unable to be handled by the SPICE can be wholly simulated by the SPICE after the reduction by the first embodiment. The present invention thus shortens a total simulation time of large-scale circuits.

The first embodiment secures high simulation accuracy. Namely, the first embodiment controls a SPICE simulation error within 3.5% compared with simulation carried out on non-reduced circuit data.

The quantitative effects of the present invention are not limited to those mentioned above.

The present invention is applicable not only to circuits mentioned above but also to other circuits.

Although the above explanation mainly relates to SRAMs, the first embodiment is also applicable to DRAMs. The DRAMs are fabricated as compilable cells and are assembled with SRAMs into system chips these days. The reduction method of the first embodiment is applicable to efficiently extract essential parts from the DRAMs and verify the characteristics of the DRAMs according to the essential parts. The DRAMs are far larger than the SRAMs in scale, and therefore, the advantages of the reduction method of the first embodiment are more conspicuous when applied to the DRAMs.

Second embodiment

The second embodiment of the present invention will be explained mainly in connection with the difference thereof from the first embodiment.

The second embodiment adds to the first embodiment a function of specifying the state of an arbitrary node in given circuit data.

In step S10 of FIG. 5, the first embodiment refers to external inputs such as source voltages in a given netlist, finds nodes that are fixed to a source or ground voltage, and starting from these nodes, sequentially fixes the states of nodes in the netlist. On the other hand, step S15 of the second embodiment of FIG. 21 refers to external inputs as well as states entered by user for arbitrary nodes.

Figure 21:
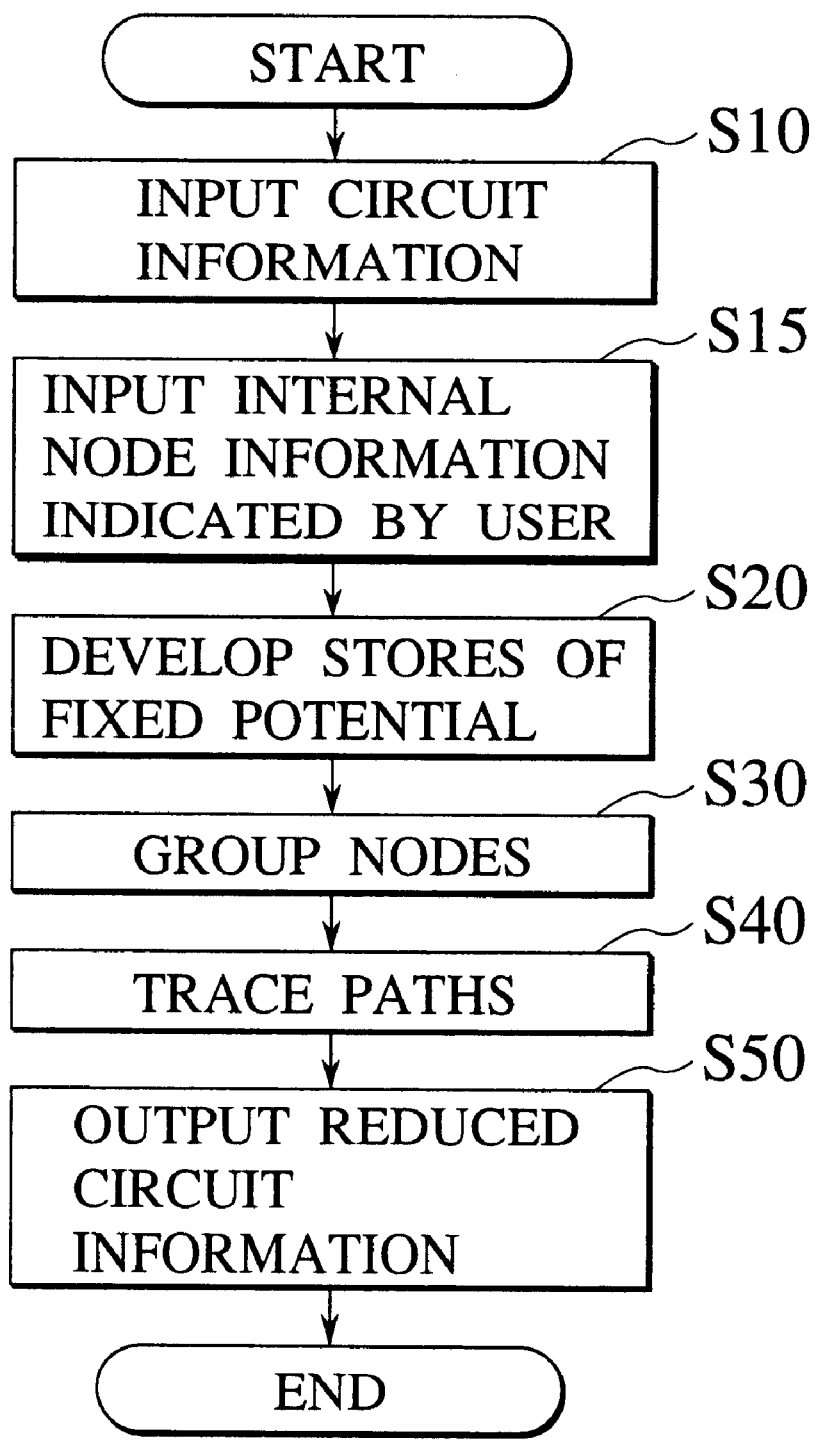
FIG. 21 is a flowchart showing a circuit reduction algorithm according to the second embodiment.

Steps S20 to S50 of FIG. 21 for sequentially developing states to nodes, grouping the nodes, tracing paths, and providing reduced circuit data correspond to steps S20 to S50 of FIG. 5, and therefore, are not explained again.

An operation of specifying the state of a node in step S15 and an operation of developing states to nodes in step S20 of FIG. 21 will be explained in connection with the internal nodes of a latch.

Figure 19:
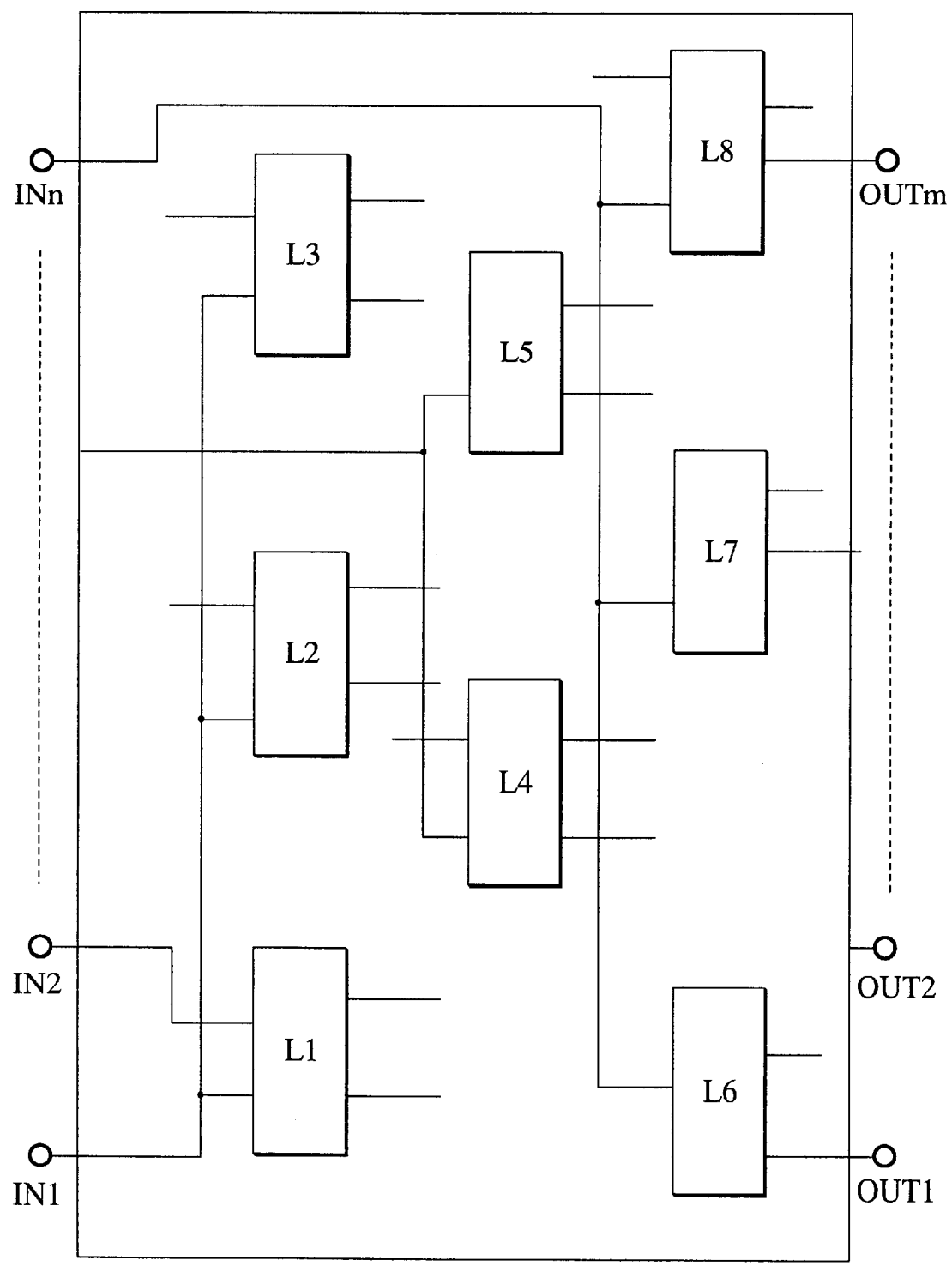
FIG. 19 shows circuit data including latches to be reduced according to the present invention.
Figure 20A:
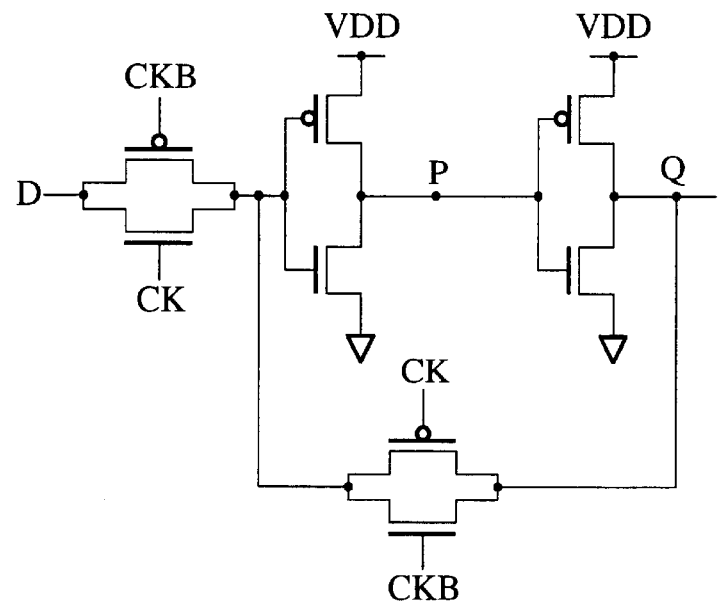
FIGS. 20A and 20B show the specifying of the state of an internal node according to a second embodiment of the present invention.
Figure 20B:
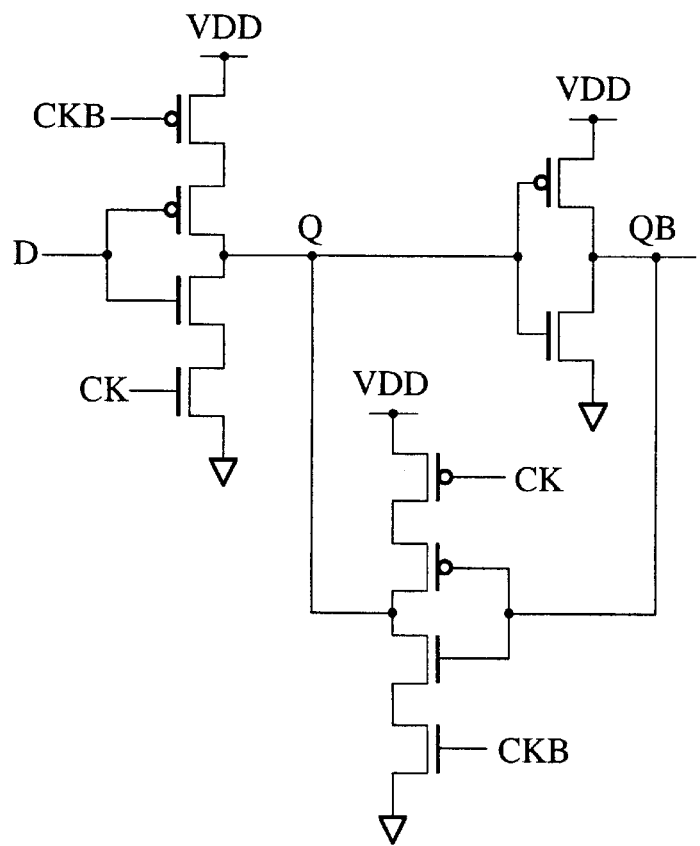

FIG. 19 shows a circuit including latches used for a memory or a logic circuit. In addition to the latches L1 to L8, there are arranged primary input nodes IN1 to INn and primary output nodes OUT1 to OUTn. FIG. 20(A) shows an example of specifying the potential of a node P in a latch, and FIG. 20(B) shows an example of specifying the potential of a node Q in a latch. The potential is high (VDD), low (VSS or ground), or intermediate.

Figure 22:
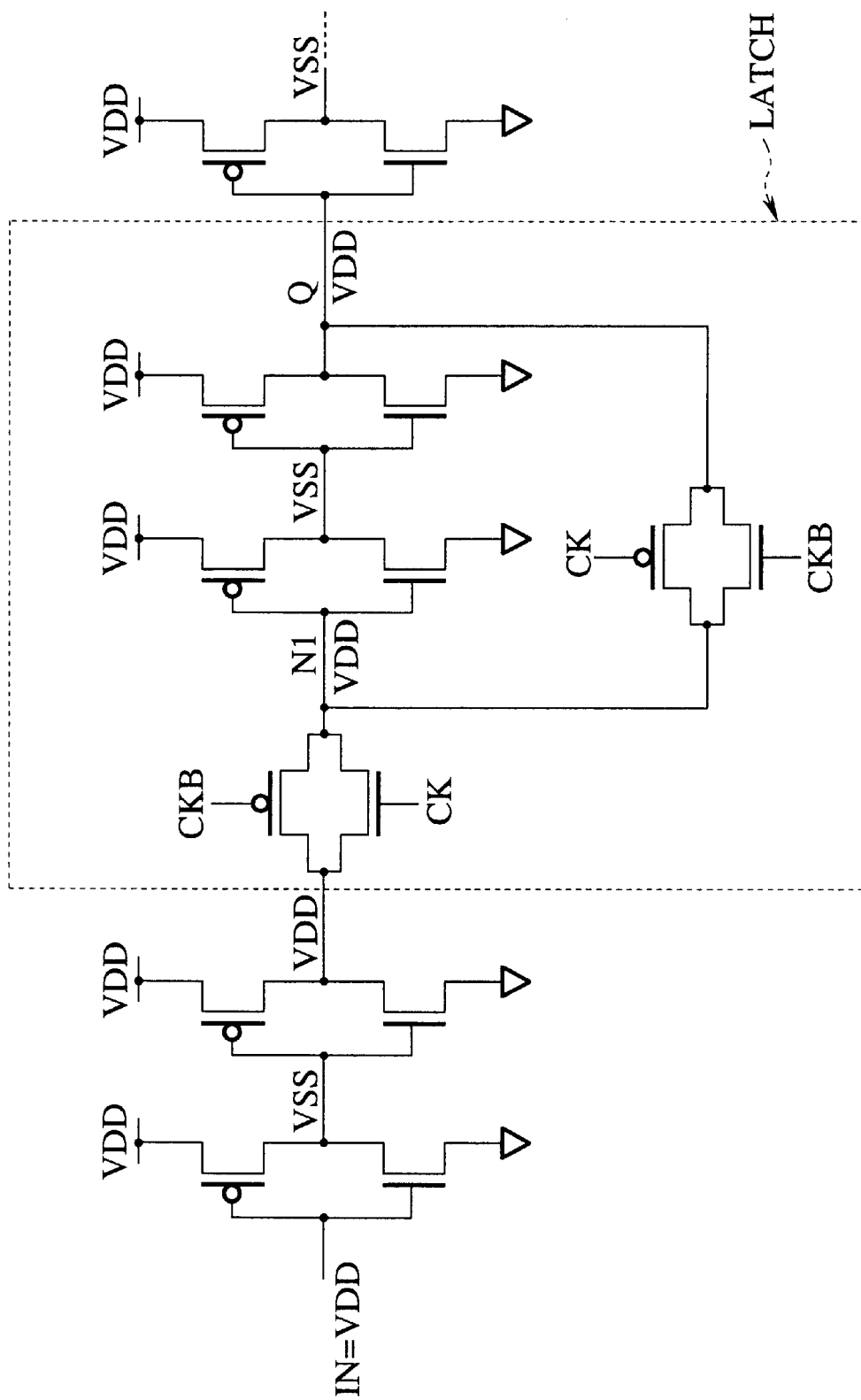
FIG. 22 shows a part of the circuit of FIG. 19 with a node whose state is specified according to the second embodiment.

FIG. 22 shows a part of the circuit of FIG. 19. An area surrounded with a dotted line corresponds to an internal circuit of one of the latches L1 to L8 of FIG. 19.

A given external input IN=VDD is developed to VSS to VDD. Thereafter, there is a node N1 which receives clock signals CK and CKB. These clock signals vary the state of the node N1, and therefore, the state of the node N1 is unfixable.

The second embodiment enables the state of the node N1 to be specified in the netlist received in step S10 of FIG. 21. For example, the node N1 is specified to take VDD with the following statement:

*S set NODE N1 VDD

Alternatively, the second embodiment may issue a control command to execute the above-mentioned statement before step S20 of FIG. 21, or may read a list of node state specifying commands in a file.

According to the above statement, states are developed from IN=VDD to VSS to VDD and from N1=VDD to VSS to VDD to VSS.

In this way, the second embodiment enables a user to specify the state of an optional node in given circuit data. Even a node whose state is unfixable from an external input can have a fixed state to develop states to nodes that follow. For example, a node whose state varies depending on clock inputs can be fixed at a specified state, which is extendable to nodes that follow. This technique expands a reduction range of a given netlist and improves the reduction ratio of the netlist.

Third embodiment

The third embodiment of the present invention will be explained mainly in connection with the difference thereof from the first and second embodiments.

The third embodiment adds to the first and second embodiments a function of controlling the range of reduction of given circuit data.

The third embodiment determines a reduction range in given circuit data. The third embodiment specifies the arbitrary number of stages starting from each extracted node on the path, the specified point is in the object area to be reduced outside the path being traced, so that the extracted elements are not reduced. The specified number of stages indicates that of load capacitance to be extracted.

The load capacitance elements include transistor gate capacitance elements, transistor junction capacitance elements, and wiring parasitic capacitance elements.

According to the first embodiment, steps S40 and S50 of FIG. 5 and steps S45 and S46 of FIG. 11 trace a path and extract nodes and elements connected to the nodes from reachable groups. Step S47 of FIG. 11 sets VSS or VDD for nodes that are connected to the extracted elements and are not contained in the reachable groups.

At this moment, the third embodiment extracts load capacitance elements from an arbitrary number of stages. The number of stages may be entered as a part of the input netlist received in step S10, or as a control command.

The third embodiment basically follows steps S10 to S50 of FIG. 5 of the first embodiment, and these steps are not explained again.

Figure 23:
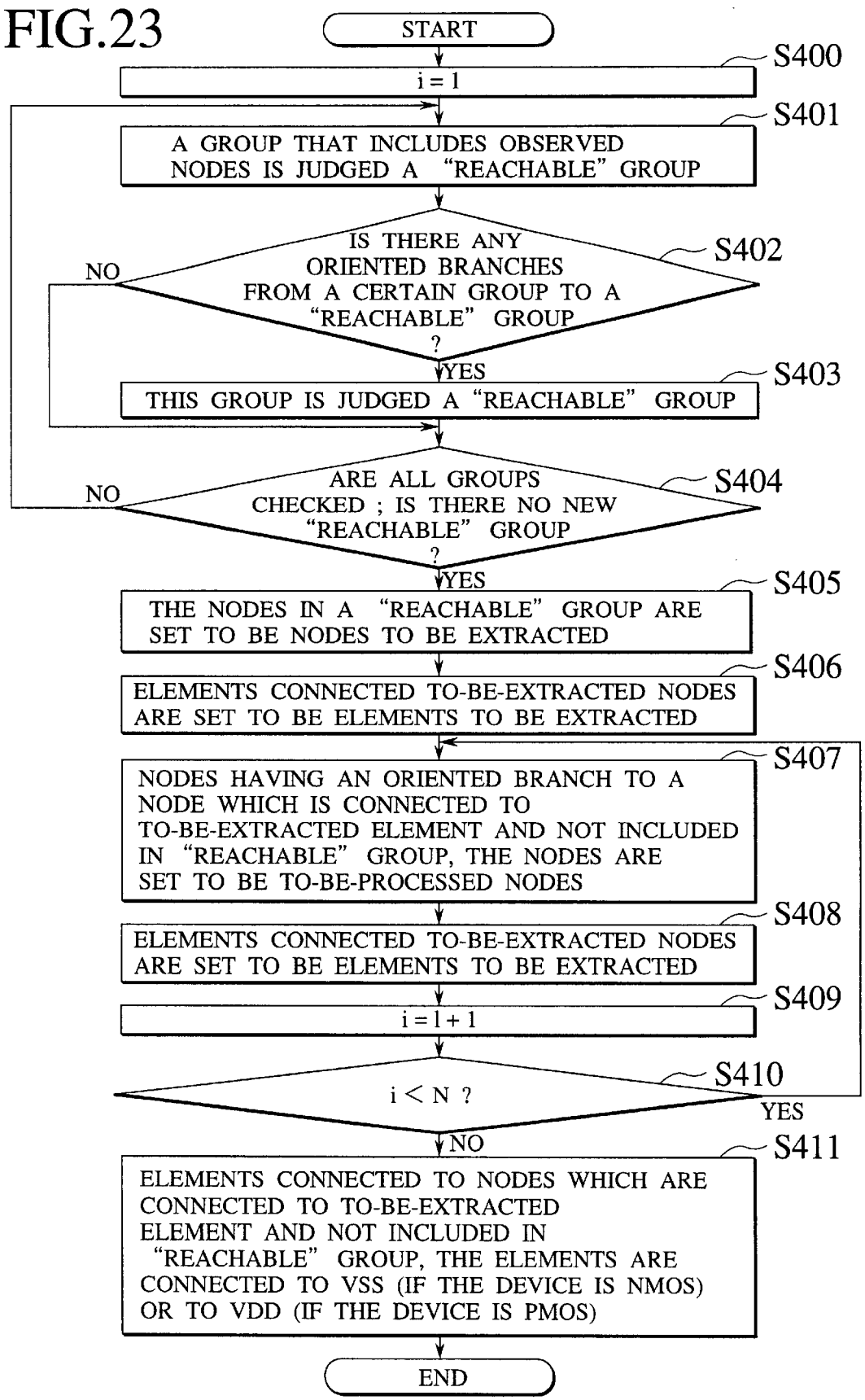
FIG. 23 is a flowchart showing a path tracing algorithm according to a third embodiment of the present invention.

The characteristic part of the third embodiment is shown in the flowchart of FIG. 23 which corresponds to the path tracing step S40 of FIG. 5.

The number of stages of load capacitance elements to be picked up is N (a natural number entered by user). The third embodiment employs a counter i to count the number of stages. Step S400 initializes the counter i. Steps S401 to S406 are equal to steps S41 to S46 of FIG. 11 of the first embodiment, and therefore, are not explained again.

The third embodiment picks up nodes within the N stages from the nodes and elements extracted in steps S405 and S406, as well as elements connected to the picked-up nodes according to oriented branches. Namely, step S407 finds nodes that are connected to the elements extracted in step S406 and are not included in the reachable groups. Thereafter, step S407 searches for nodes to which oriented branches are extended from the found nodes. Step S408 extracts elements connected to the nodes extracted in step S407. Steps S409 and S410 repeat steps S407 and S408 until the counter i counts N. If an extracted node has m oriented branches, steps S407 and S408 are repeated for N stages for each of the m oriented branches.

Step S411 corresponds to step S47 of FIG. 11. Namely, step S411 finds nodes that are connected to the extracted elements and are not contained in the reachable node groups, and then, finds elements connected to the nodes thus found. Among the found elements, step S411 connects NMOSs to VSS and PMOSs to VDD.

A concrete example of the third embodiment will be explained.

Figure 24:
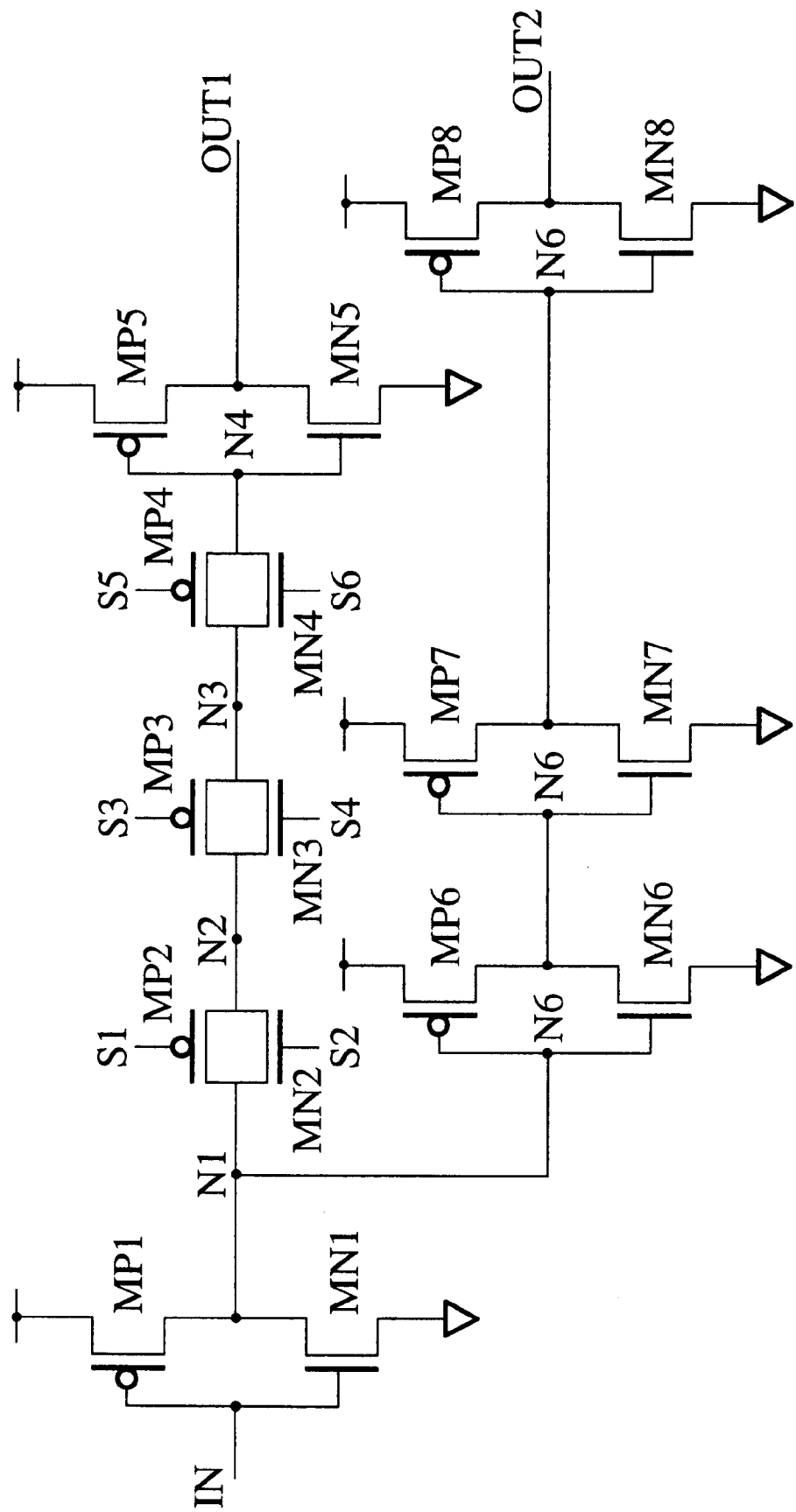
FIG. 24 shows an example of circuit data to be reduced according to the third embodiment.

FIG. 24 shows a circuit before reduction. The circuit has an input node IN, output nodes OUT1 and OUT2, PMOS transistors MP1 to MP8, and NMOS transistors MN1 to MN8. This circuit is provided in the form of a SPICE netlist, and it is assumed in the netlist that an input signal to the input node IN temporally varies and the output node OUT1 is selected as an observation node.

First, the third embodiment follows the steps shown in FIG. 5. Namely, step S20 develops states to nodes, step S30 groups nodes, and step S40 selects a path of IN, N1, N2, N3, N4, and OUT1. The nodes IN, N1, N2, N3, N4, and OUT1 are extracted from the path. Also extracted are elements MP1, MN1, . . . , MP5, and MN5 connected to these nodes.

Figure 25A:
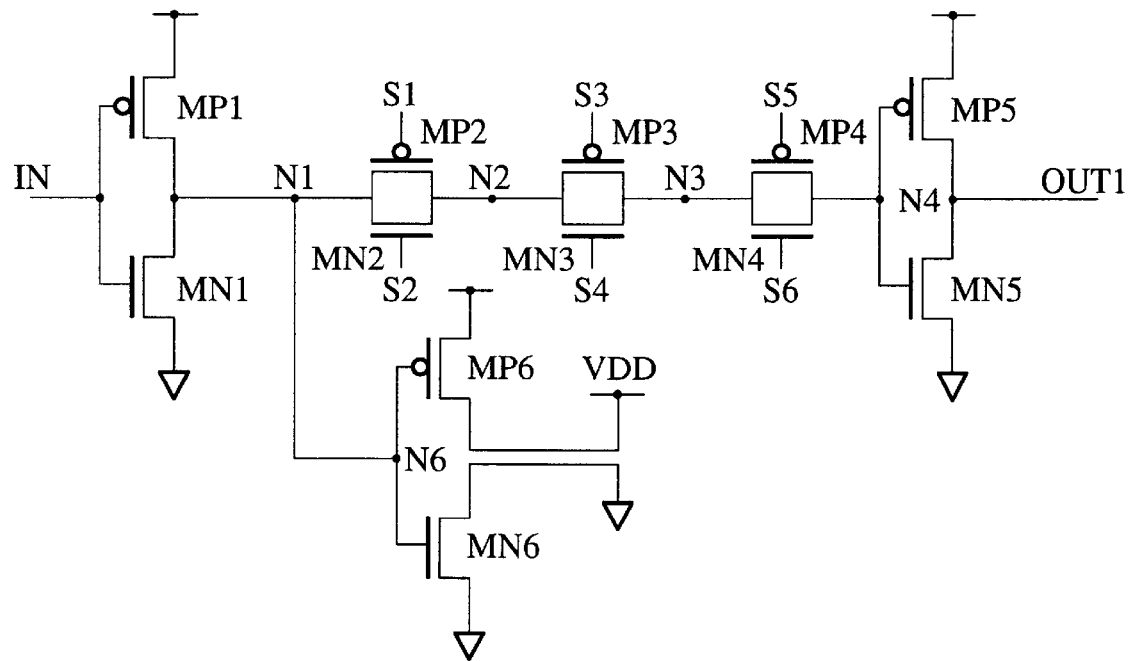
FIGS. 25A and 25B show circuit data reduced from the circuit data of FIG. 24 according to the third embodiment.

Starting from these extracted nodes, a first stage of load capacitance elements is extracted as shown in FIG. 25(A). Load elements MP6 and MN6 connected to the extracted node N1 are selected.

Figure 25B:
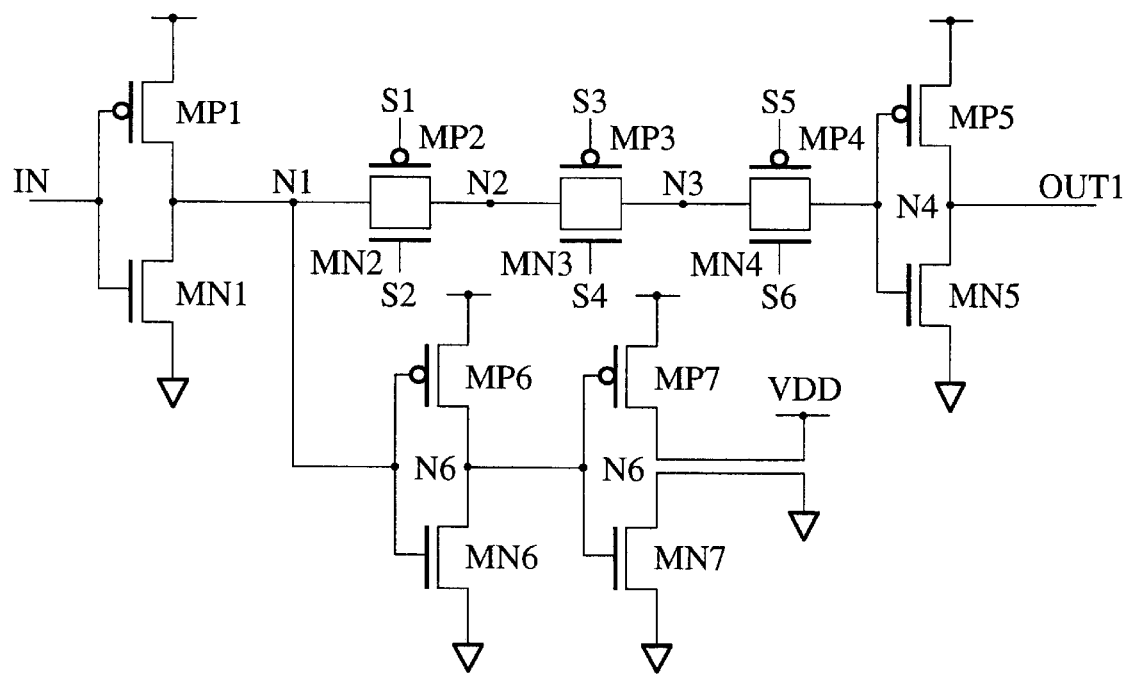

Similarly, first and second stages of load capacitance elements are extracted as shown in FIG. 25(B). Load elements MP6 and MN6 in the first stage and load elements MP7 and MN7 in the second stage starting from the extracted node N1 are picked up.

The number of stages of load capacitance elements to be picked up according to the third embodiment determines the accuracy of simulation carried out on a reduced netlist. The number of stages of load elements to be picked up and a reduction ratio are tradeoffs, and therefore, they are determined according to the scale of a circuit to simulate and the required accuracy of simulation.

In this way, the third embodiment specifies an arbitrary number of stages of load elements to be selected, to thereby control the range of reduction of given circuit data. According to the scale of a circuit to simulate and the purpose of simulation, the third embodiment optimizes a reduction ratio and the accuracy of simulation.

Fourth embodiment

The fourth embodiment of the present invention will be explained mainly in connection with the difference thereof from the first to third embodiments.

The fourth embodiment adds a graphical I/O function to the first to third embodiments.

Reduction steps of the fourth embodiment are substantially the same as those of the first embodiment of FIG. 5, and therefore, are not explained again.

A circuit data entering process specific to the fourth embodiment will be explained.

When entering circuit data in step S10 of FIG. 5, the first embodiment makes a user to edit a netlist of FIG. 26 with a text editor and add statements to specify input vectors and observation points as indicated with bold characters in FIG. 26.

Figure 27:
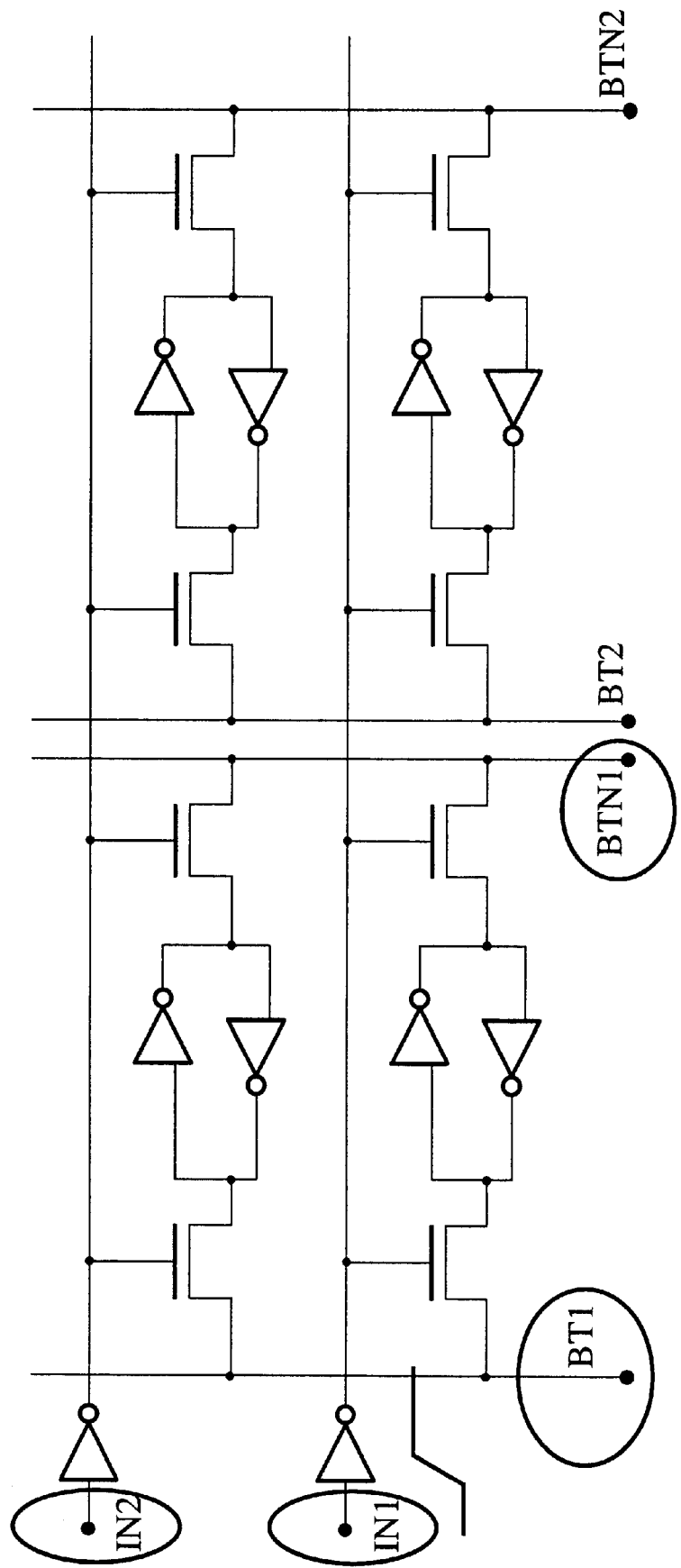
FIG. 27 shows a input circuit diagram to be reduced into the fourth embodiment.

On the other hand, the fourth embodiment allows the user to visually enter vectors and observation points with the use of, for example, a schematic editor on a displayed circuit diagram as shown in FIG. 27.

A data entering sequence according to the fourth embodiment will be explained in detail.

The user employs, for example, a mouse to mark each node (IN2) to be fixed at VDD or VSS on a circuit diagram displayed on an editor screen. The user marks a node (IN1) whose input vector temporally varies and optionally draws an input waveform applied to the node. The input vector may activate a critical path or specify a setup time and a hold time. The user also marks observation nodes (BT1, BTN1).

The instructions entered by the user are taken into a netlist, and step S20 and the steps that follow proceed with the reduction operation accordingly.

A process of providing reduced circuit data will be explained.

Step S50 of FIG. 5 provides reduced circuit data. At this time, the first embodiment provides the reduced circuit data in the forms of a reduced netlist and a log. To grasp how the original circuit data has been reduced, the user must compare the reduced netlist and log with the original netlist.

Figure 28:
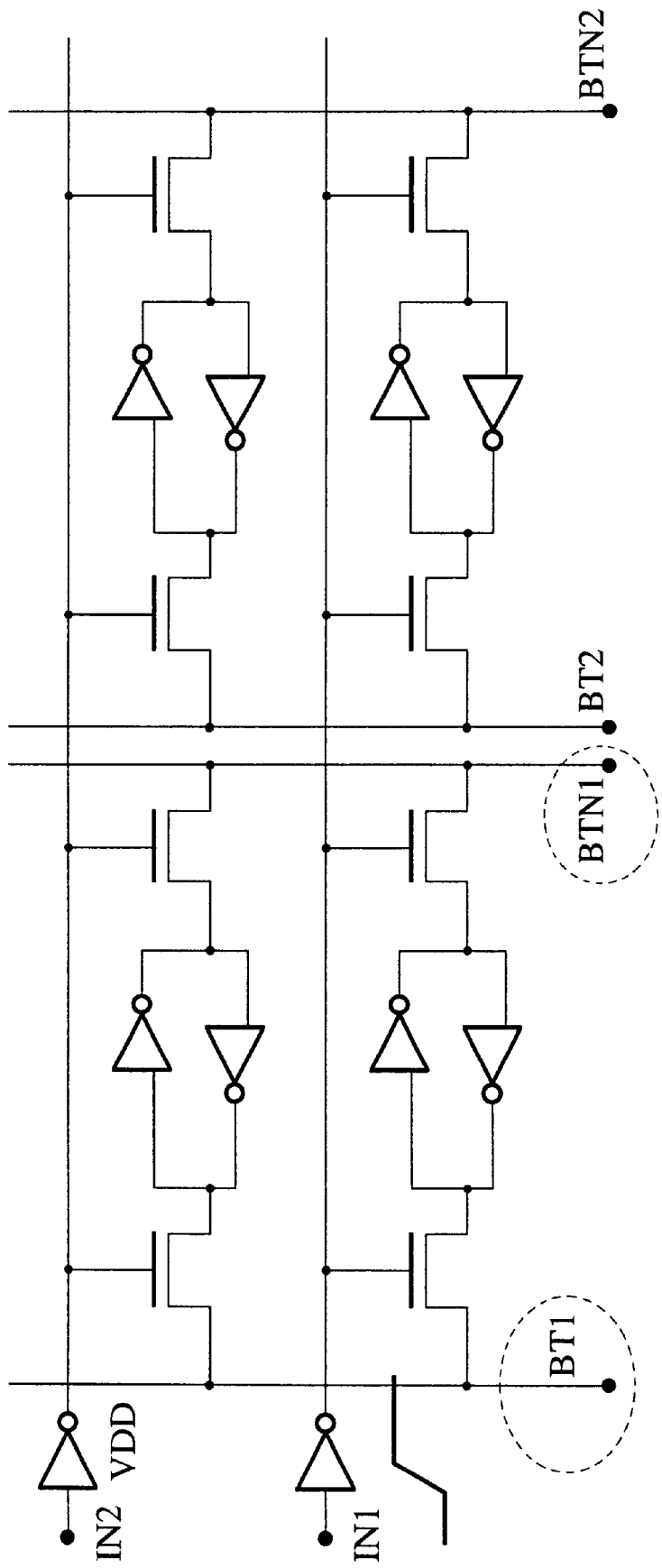
FIG. 28 shows a circuit diagram before reduction.
Figure 29:
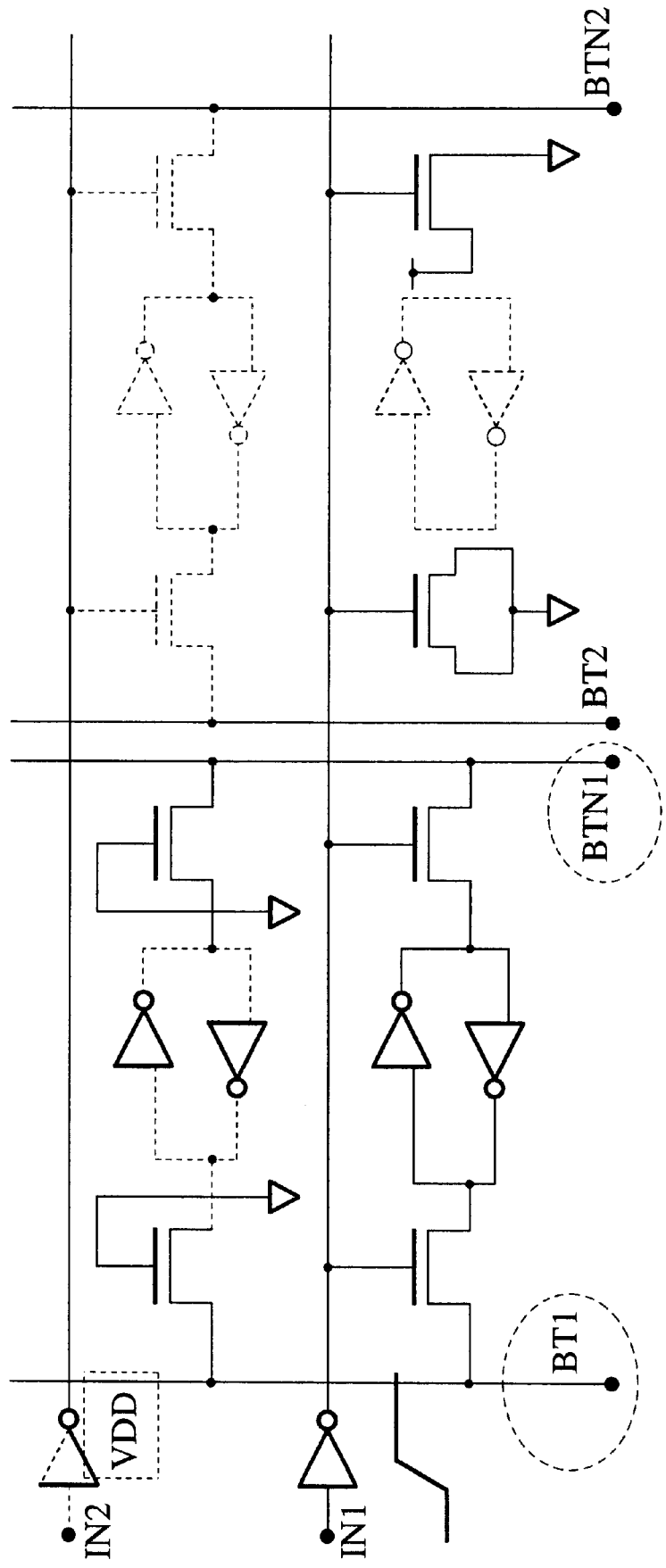
FIG. 29 shows a circuit diagram reduced from the data of FIG. 28 according to the fourth embodiment.

On the other hand, the fourth embodiment displays a reduced netlist and a log together with a reduced circuit diagram of FIG. 29 prepared from an original circuit diagram of FIG. 28. At this time, the reduced netlist and log may be omitted from the display, and only the reduced circuit diagram of FIG. 29 may be displayed.

The reduced circuit diagram differently displays reduced (omitted) parts and extracted (remaining) parts so that they are discriminable from each other.

For example, the reduced parts are displayed with dotted lines or displayed by highlighting, blinking, or coloring.

In this way, the fourth embodiment lets the user visually enter input vectors and observation nodes on a circuit diagram and discriminate reduced parts from picked-up parts on a reduced circuit diagram.

The fourth embodiment allows the user to easily and speedily specify data necessary for reducing a circuit and easily discriminate reduced parts from selected parts on a reduced circuit diagram. This improves a user interface in reducing circuit data.

The fourth embodiment is achievable singularly or in combination with the first to third embodiments.

Fifth embodiment

The fifth embodiment of the present invention will be explained mainly in connection with the difference thereof from the first to fourth embodiments.

The fifth embodiment adds to the first to fourth embodiments a function of merging parallel elements in a reduced circuit data.

Reduction steps of the fifth embodiment are substantially the same as those of the first embodiment of FIG. 5, and therefore, are not explained again. In step S50 of FIG. 5, the fifth embodiment generates new transistor by merging a plurality of parallel transistors.

Figure 30:
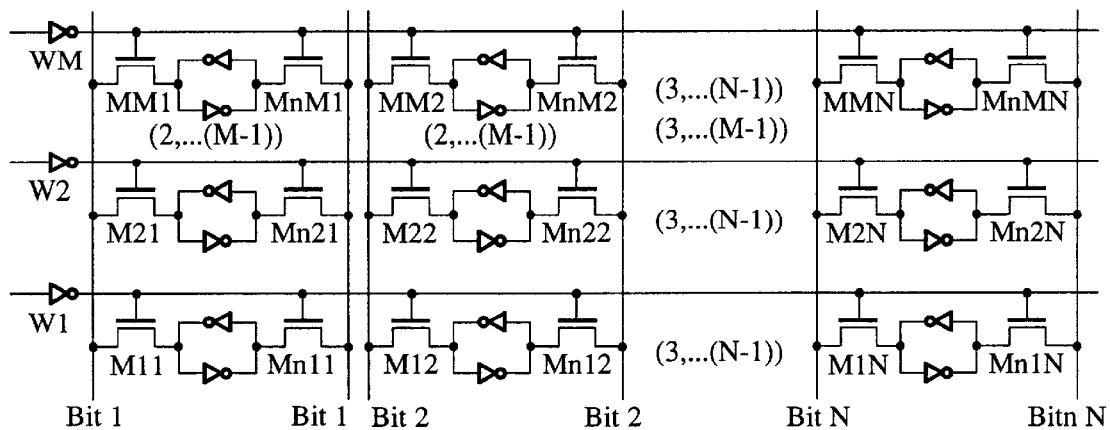
FIG. 30 shows an example of circuit diagram to be reduced according to the fifth embodiment.

FIG. 30 shows a memory core of an SRAM. The memory core has transistors M11 to MnMN, word lines W1 to WM, and bit lines bit1 to bitnN.

It is assumed that observation nodes written in a SPICE netlist are W1, bit1, and bitn1.

Figure 31:
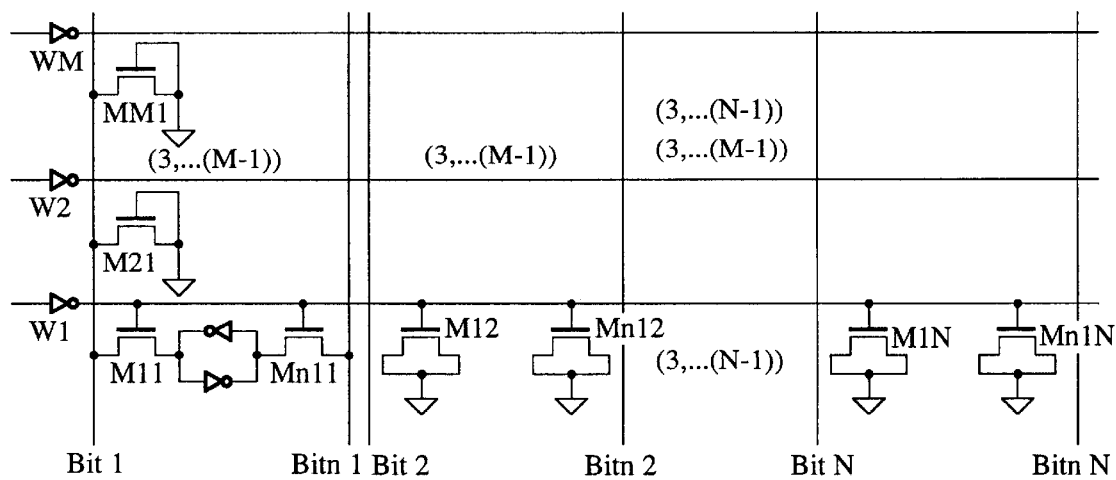
FIG. 31 shows a circuit reduced from FIG. 30 according to the fifth embodiment.

FIG. 31 shows a reduced circuit made from the circuit of FIG. 30 according to the present invention.

Figure 32:
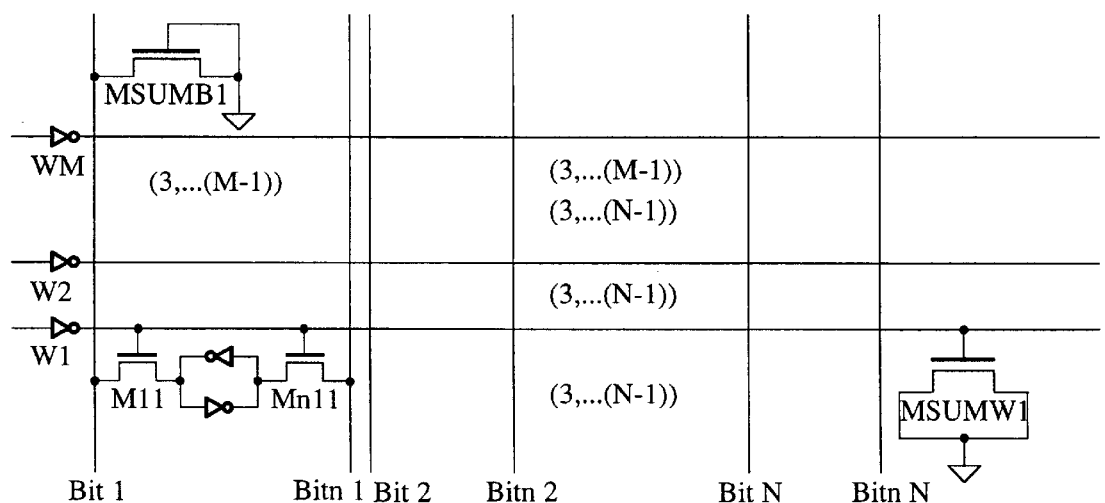
FIG. 32 shows a result of the merging of parallel transistors carried out on the circuit of FIG. 31 according to a fifth embodiment of the present invention.

FIG. 32 shows a result of the merging of parallel transistors shown in FIG. 31. The drain nodes of M-1 transistors M21 to MM1 are connected to the bit line bit1 in FIG. 31. Merging these transistors further improves the reduction ratio of the circuit. Namely, these transistors are replaced with a transistor MSUMB1 whose width is the sum of the widths of the M-1 transistors.

In FIG. 31, the gate terminals of 2N-2 transistors M12 to Mn1N are connected to the word line W1, and the sources and drains thereof are grounded. Accordingly, they are replaced with a transistor MSUMW1 whose width is the sum of the widths of the 2N-2 transistors.

This replacement may be carried out by transistor such as MOS, or capacitance. The fifth embodiment generates new element by merging a plurality of parallel elements in a regularly arranged circuit such as memory cell, and replace the original parallel elements with the generated element.

In this way, the fifth embodiment further improves a reduction ratio when reducing a given circuit.

In summary, the present invention extracts only elements and nodes that are influenced by a propagation of a varying state in an input signal and whose varying state influence observation nodes, to thereby reduce given circuit data. Namely, the present invention extracts essential elements that influence a simulation result from a given circuit, reduces the given circuit according to the extracted elements, and carries out simulation on the reduced circuit.

The present invention greatly reduces a simulation time while securing the accuracy of simulation. The present invention is capable of evaluating the characteristics of even a large-scale integrated circuit with high accuracy within a practical time.

The present invention is applicable to many circuits because it carries out reduction based on only the characteristics of MOS transistors. Once given empirical or analytic data for critical paths and input vectors to activate the critical paths, the present invention can handle not only memory cells of ASIC SRAMs but also control parts of peripheral circuits of DRAMs and SRAMs, logic circuits such as datapath and ALU (Arithmetic Logical Unit) of microprocessors, general-purpose SRAMs, DRAMs, and flash memories, and other MOS circuits.

Various modifications will become possible for those skilled in the art after receiving the teachings of this disclosure without departing from the scope thereof. It is intended, therefore, that all matters contained in the foregoing description and in the drawings shall be interpreted as illustrative only not as limitative of the present invention.

What is claimed is:

1. A computer implemented method of reducing circuit data to be simulated automatically, comprising the steps of:
   (a) entering circuit data to be simulated including an input vector and an observation point for the circuit data;
   (b) finding nodes and elements that are in a path between an input node whose potential varies during simulation and an observation node in the given circuit data;
   (c) extracting a circuit data corresponding to the found nodes and elements according to the input vector and observation point; and
   (d) outputting extracted circuit data whose size is reduced, whereby only element data that influences a result of simulation is provided to a circuit simulation program.

2. The method of claim 1, wherein the step (c) includes the steps of:
   c1) finding nodes whose potential is fixed during the simulation, in the circuit data according to the input vector, and according to the found nodes, so as to determine the ON/OFF state of each MOS transistor which is contained in the circuit data and whose gate potential is fixed; and
   c2) grouping the nodes according to the ON/OFF states of the MOS transistors so as to extract nodes from an input signal path between a node group on the gate side of a MOS transistor and a node group on the channel side of the MOS transistor.

3. A computer implemented method of reducing circuit data to be simulated automatically, comprising the steps of:
   (a) entering circuit data to be simulated including an input vector and an observation point for the circuit data;
   (b) sequentially developing the potential state of each node whose potential must be fixed at a potential level of high or low during simulation in the circuit data, according to information about fixed potential nodes and initial node values, the information about fixed-potential nodes being obtained from input vectors that activate a route for transmitting an input signal, the initial nodes values being contained in the circuit data;
   (c) deleting an element having a terminal that is connected to one of the fixed-potential nodes from the circuit data;
   (d) forming a node group from nodes connected to one another through the channels of MOS transistors among the circuit data provided by the step (c) and forming an oriented graph from a node group on the gate side of a MOS transistor toward a node group on the channel side of the MOS transistor;
   (e) extracting node groups on a path between an input node at which the state of an input vector varies and an observation node, by tracing the path on the oriented graphs;
   (f) extracting nodes from the extracted node groups, as well as elements connected to the extracted nodes; and
   (g) outputting extracted circuit data whose size is reduced, whereby only element data that influences a result of simulation is provided to a circuit simulation program.

4. The method of claim 1, wherein:
the input vector and/or observation point is provided as a part of the circuit data to be simulated.

5. The method of claim 3, further comprising the step of:
   (h) deleting, from the circuit data, at least one of resistors, capacitors, inductance elements, control voltages, and diodes connected to MOS transistors that are not extracted from the circuit data.

6. The method of claim 1, wherein:
the circuit data is one of circuit data before layout, circuit data after layout, and printed circuit data.

7. The method of claim 3, further comprising the step of:
   (h) specifying, in the circuit data, arbitrary sub-circuits that must not be reduced and must be extracted.

8. The method of claim 3, wherein:
the input vector and/or observation point is specified at nodes on a circuit diagram that is prepared from the circuit data and is displayed on a screen.

9. The method of claim 3, further comprising the step of:
(h) providing parts extracted from the circuit data and parts not extracted from the circuit data so that they are discriminable from each other on a circuit diagram that is prepared from the circuit data.

10. The method of claim 3, further comprising the step of:
(h) specifying the potential state of an arbitrary node in the circuit data.

11. The method of claim 3, further comprising the step of:
(h) specifying an arbitrary number of extraction stages of load capacitance starting from each node in the path so as to extract element data that are in the specified extraction stages.

12. The method of claim 3, wherein:
the potential state to be fixed for a node is one of VDD, VSS, and an intermediate.

13. The method of claim 3, further comprising the step of:
(h) merging elements connected in parallel into a merged element whose width is the sum of the width of the elements.

14. A computer implemented method of simulating an integrated circuit according to input vectors provided for circuit data that forms the integrated circuit automatically, comprising the steps of:
(a) entering circuit data to be simulated including an input vector and an observation point for the circuit data;
(b) finding nodes and elements that are in a path between an input node whose potential varies during simulation and an observation node in the given circuit data;
(c) extracting a circuit data corresponding to the found nodes and elements according to the input vector and observation point;
(d) outputting extracted circuit data whose size is reduced, whereby only element data that influence a result of simulation is provided to a circuit simulation program; and
(e) simulating a reduced circuit data program.

15. A computer implemented method of simulating an integrated circuit according to input vectors provided for circuit data that forms the integrated circuit automatically, comprising the steps of:
(a) entering circuit data to be simulated including an input vector and an observation point for the circuit data;
(b) sequentially developing the potential state of each node whose potential must be fixed at a potential level of high or low during simulation in the circuit data, according to information about fixed-potential nodes and initial node values, the information about fixed-potential nodes being obtained from input vectors that activate a route for transmitting an input signal, the initial nodes values being contained in the circuit data;
(c) deleting an element having a terminal that is connected to one of the fixed-potential nodes from the circuit data;
(d) forming a node group from nodes connected to one another through the channels of MOS transistors among the circuit data provided by the step (c) and forming an oriented graph from a node group on the gate side of a MOS transistor toward a node group on the channel side of the MOS transistor;
(e) extracting node groups on a path between an input node at which the state of an input vector varies and an observation node, by tracing the path on the oriented graphs;
(f) extracting nodes from the extracted node groups, as well as elements connected to the extracted nodes; and
(g) outputting extracted circuit data whose size is reduced, whereby only element data that influences a result of simulation is provided to a circuit simulation program.

16. A recording medium readable by computer, containing instructions for causing a computer system to reduce circuit data to be simulated automatically, the instructions causing the computer system to perform the following steps:
(a) entering circuit data to be simulated including an input vector and an observation point for the circuit data;
(b) finding nodes and elements that are in a path between an input node whose potential varies during simulation and an observation node in the given circuit data;
(c) extracting a circuit data corresponding to the found nodes and elements according to the input vector and observation point; and
(d) outputting extracted circuit data whose size is reduced, whereby only element data that influences a result of simulation is provided to a circuit simulation program.

17. The recording medium of claim 16, wherein the module (b) includes modules for:
(b1) finding nodes whose potential is fixed during the simulation, in the circuit data according to the input vector, and according to the found nodes, so as to determine the ON/OFF state of each MOS transistor which is contained in the circuit data and whose gate potential is fixed; and
(b2) grouping the nodes according to the ON/OFF states of the MOS transistors so as to extract nodes from an input signal path between a node group on the gate side of a MOS transistor and a node group on the channel side of the MOS transistor.

18. A recording medium readable by computer, containing instructions for causing a computer system to reduce circuit data to be simulated automatically, the instructions causing the computer system to perform the following steps:
(a) entering circuit data to be simulated including an input vector and an observation point for the circuit data;
(b) sequentially developing the potential state of each node whose potential must be fixed at a potential level of high or low during simulation in the circuit data, according to information about fixed-potential nodes and initial node values, the information about fixed-potential nodes being obtained from input vectors that activate a route for transmitting an input signal, the initial nodes values being contained in the circuit data;
(c) deleting an element having a terminal that is connected to one of the fixed-potential nodes from the circuit data;
(d) forming a node group from nodes connected to one another through the channels of MOS transistors among the circuit data provided by the step (c) and forming an oriented graph from a node group on the gate side of a MOS transistor toward a node group on the channel side of the MOS transistor;
(e) extracting node groups on a path between an input node at which the state of an input vector varies and an observation node, by tracing the path on the oriented graphs;
(f) extracting nodes from the extracted node groups, as well as elements connected to the extracted nodes; and
(g) outputting extracted circuit data whose size is reduced whereby only element data that influences a result of simulation is provided to a circuit simulation program.

19. A recording medium readable by computer, containing instructions for causing a computer system to simulate an integrated circuit according to input vectors provided for circuit data that forms the integrated circuit automatically, the instructions causing the computer system to perform the following steps:

(a) entering circuit data to be simulated including an input vector and an observation point for the circuit data;

(b) finding nodes and elements that are in a path between an input node whose potential varies during simulation and an observation node in the given circuit data;

(c) extracting a circuit data corresponding to the found nodes and elements according to the input vector and observation point;

(d) outputting extracted circuit data whose size is reduced, whereby only element data that influences a result of simulation is provided to a circuit simulation; and (e) simulating a reduced circuit data program without replacing portion of the circuit data with a specific model.

20. A recording medium readable by computer, containing instructions for causing a computer system to simulate an integrated circuit according to input vectors automatically, the instructions causing the computer system to perform the following steps:

(a) entering circuit data to be simulated including an input vector and an observation point for the circuit data;

(b) sequentially developing the potential state of each node whose potential must be fixed at a potential level of high or low during simulation in the circuit data, according to information about fixed-potential nodes and initial node values, the information about fixed-potential nodes being obtained from input vectors that activate a route for transmitting an input signal, the initial nodes values being contained in the circuit data;

(c) deleting an element having a terminal that is connected to one of the fixed-potential nodes from the circuit data;

(d) forming a node group from nodes connected to one another through the channels of MOS transistors among the circuit data provided by the step (c) and forming an oriented graph from a node group on the gate side of a MOS transistor toward a node group on the channel side of the MOS transistor;

(e) extracting node groups on a path between an input node at which the state of an input vector varies and an observation node, by tracing the path on the oriented graphs;

(f) extracting nodes from the extracted node groups, as well as elements connected to the extracted nodes; and (g) outputting extracted circuit data whose size is reduced, whereby only element data that influences a result of simulation is provided to a circuit simulation program.

21. A computer implemented method of reducing circuit data to be simulated automatically, comprising the steps of:

(a) entering circuit data to be simulated including an input vector and an observation point for the circuit data;

(b) determining a first range of the circuit data in which an input signal propagates;

(c) determining a second range in which the propagation of the input signal influences the observation point out of the first range;

(d) deleting a node excluded from the first range or the second range out of the circuit data; and (e) outputting reduced circuit data provided by the step (d), whereby only element data that influences a result of simulation is provided to a circuit simulation program only according to the characteristics of MOS transistors without replacing cell of the circuit data with a registered specific model.

22. The method of claim 21, further comprising the step of:

(f) specifying a sub-circuit which is to be excluded from circuit data reduction out of the circuit data.

* * * * *